US009190454B2

(12) United States Patent
Saitoh et al.

(10) Patent No.: US 9,190,454 B2
(45) Date of Patent: Nov. 17, 2015

(54) MEMORY DEVICE

(71) Applicant: Kabushiki Kaisha Toshiba, Minato-ku (JP)

(72) Inventors: Masumi Saitoh, Kanagawa-ken (JP); Takayuki Ishikawa, Kanagawa-ken (JP); Shosuke Fujii, Kanagawa-ken (JP); Kiyohito Nishihara, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/949,535

(22) Filed: Jul. 24, 2013

(65) Prior Publication Data

US 2014/0284535 A1 Sep. 25, 2014

Related U.S. Application Data

(60) Provisional application No. 61/803,154, filed on Mar. 19, 2013.

(51) Int. Cl.
*H01L 27/24* (2006.01)
*H01L 45/00* (2006.01)

(52) U.S. Cl.
CPC ........ *H01L 27/2436* (2013.01); *H01L 27/2481* (2013.01); *H01L 45/085* (2013.01); *H01L 45/1233* (2013.01); *H01L 45/1266* (2013.01); *H01L 45/145* (2013.01); *H01L 45/148* (2013.01); *H01L 45/1675* (2013.01)

(58) Field of Classification Search
CPC ............ H01L 27/0688; H01L 27/2436; H01L 27/2481; H01L 45/1266; H01L 45/1233; H01L 45/145; H01L 45/085; H01L 45/1675; H01L 45/148
USPC ............................. 257/2–5, 74; 365/148, 163
See application file for complete search history.

(56) References Cited

U.S. PATENT DOCUMENTS 8,026,504 B2 9/2011 Park et al.
2008/0048243 A1* 2/2008 Morikado ..................... 257/316
2008/0280415 A1* 11/2008 Kajigaya ....................... 438/382
2010/0008132 A1* 1/2010 Hwang et al. ................. 365/163
2010/0127235 A1* 5/2010 Tsukamoto et al. .............. 257/5
2010/0320527 A1* 12/2010 Okamura et al. ............. 257/324
2010/0321982 A1* 12/2010 Takagi et al. ................ 365/148

OTHER PUBLICATIONS

M.J. Lee et al. "Stack Friendly All-Oxide 3D RRAM using GaInZnO Peripheral TFT realized over Glass Substrates", IEEE International Electron Devices Meeting (IEDM) Dec. 2008, 5 pages.
U.S. Appl. No. 14/022,732, filed Sep. 10, 2013, Ishikawa, et al.

* cited by examiner

*Primary Examiner* — Jae Lee
*Assistant Examiner* — Mohammed R Alam
(74) *Attorney, Agent, or Firm* — Oblon, McClelland, Maier & Neustadt, L.L.P.

(57) ABSTRACT

A memory device according to an embodiment, includes a substrate, two or more resistance change memory cells stacked on the substrate, two or more transistors stacked on the substrate, and two or more wirings stacked on the substrate. One of the memory cells and one of the transistors are connected to each other via one of the wirings.

11 Claims, 27 Drawing Sheets

A A' 11 12 13 1
22 22 22 22 21b 41 21b 46 21a 21 35 33 32 23b(24) 31 34 41 45 43 46 42 21 21b 21a 15 10
23a 21 23b 22 35 34 23a(24) 33 32 31 21
23a 23a 21b 25

VERTICAL DIRECTION
WORD LINE DIRECTION

VERTICAL DIRECTION

WORD LINE DIRECTION 15a
21
21
21
21
A
A'
64
63
BIT LINE DIRECTION
WORD LINE DIRECTION

A
A'
11
12
13
21 31 62 63 64

15a
10
VERTICAL DIRECTION
WORD LINE DIRECTION

BIT LINE DIRECTION

WORD LINE DIRECTION

MEMORY DEVICE

CROSS-REFERENCE TO RELATED APPLICATIONS

This application is based upon and claims the benefit of priority from U.S. Provisional Patent Application 61/803,154, filed on Mar. 19, 2013; the entire contents of which are incorporated herein by reference.

FIELD

Embodiments described herein relate generally to a memory device.

BACKGROUND

As a high-capacity nonvolatile memory device for replacing floating-gate NAND flash memories, a resistance random access memory device with two-terminal memory cells arranged on cross points has been developed. In this type of memory device, cross-point structures are stacked to increase the degree of integration.

DETAILED DESCRIPTION

A memory device according to an embodiment, includes a substrate, two or more resistance change memory cells stacked on the substrate, two or more transistors stacked on the substrate, and two or more wirings stacked on the substrate. One of the memory cells and one of the transistors are connected to each other via one of the wirings.

Embodiments of the invention will now be described with reference to the drawings.

First Embodiment

First, a first embodiment is described.

The memory device according to the embodiment is a resistance random access memory device.

Figure 1:
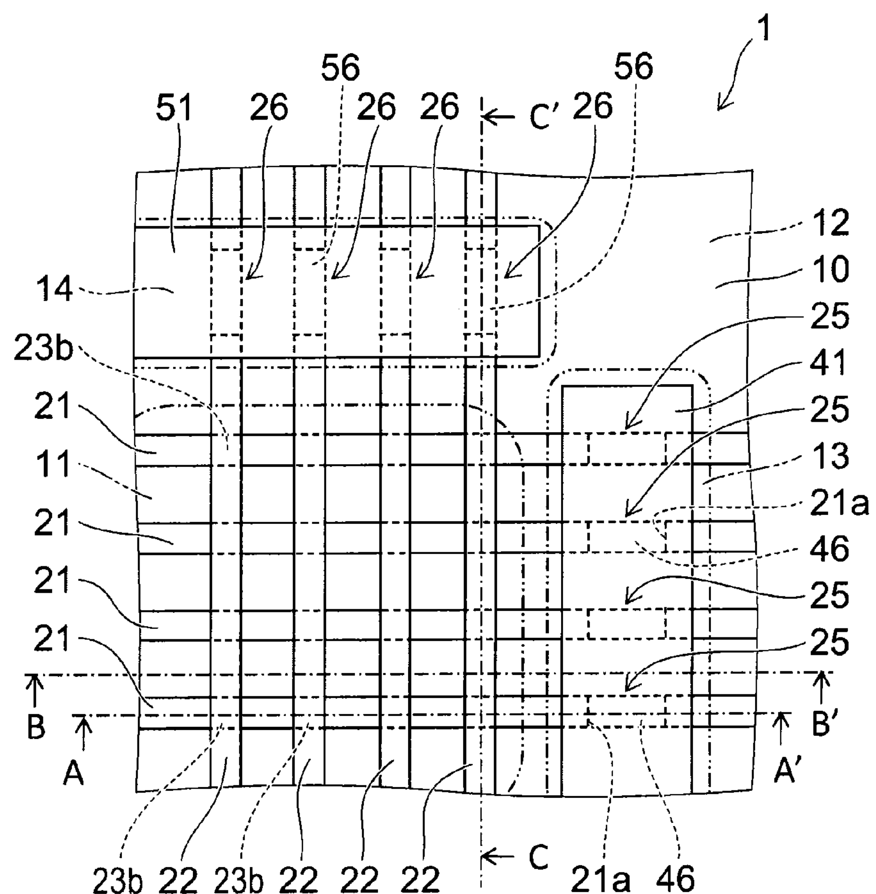
FIG. 1 is a plan view illustrating a memory device according to a first embodiment.

FIG. 1 is a plan view illustrating the memory device according to the embodiment.

Figure 2:
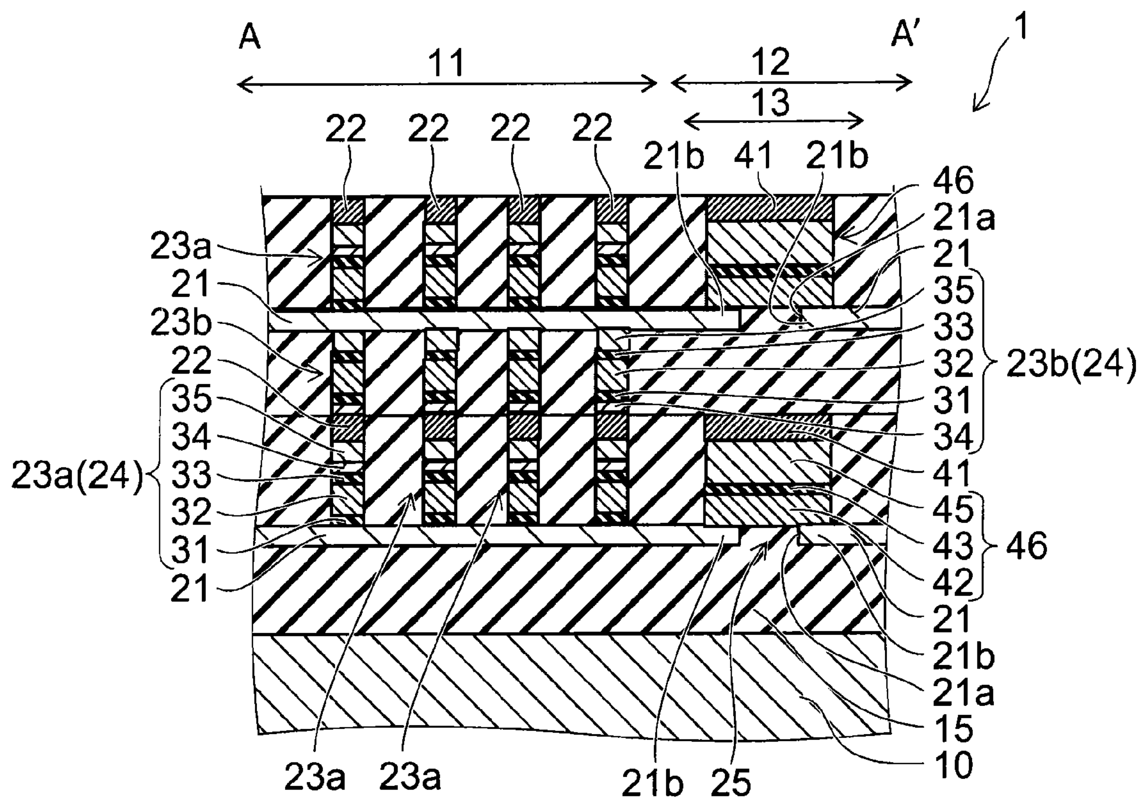
FIG. 2 is a sectional view taken along line A-A' shown in FIG. 1.
Figure 2:
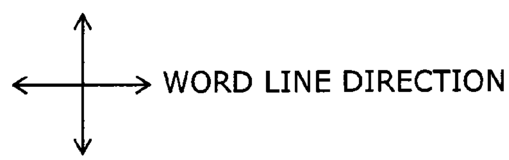

FIG. 2 is a sectional view taken along line A-A' shown in FIG. 1.

Figure 3:
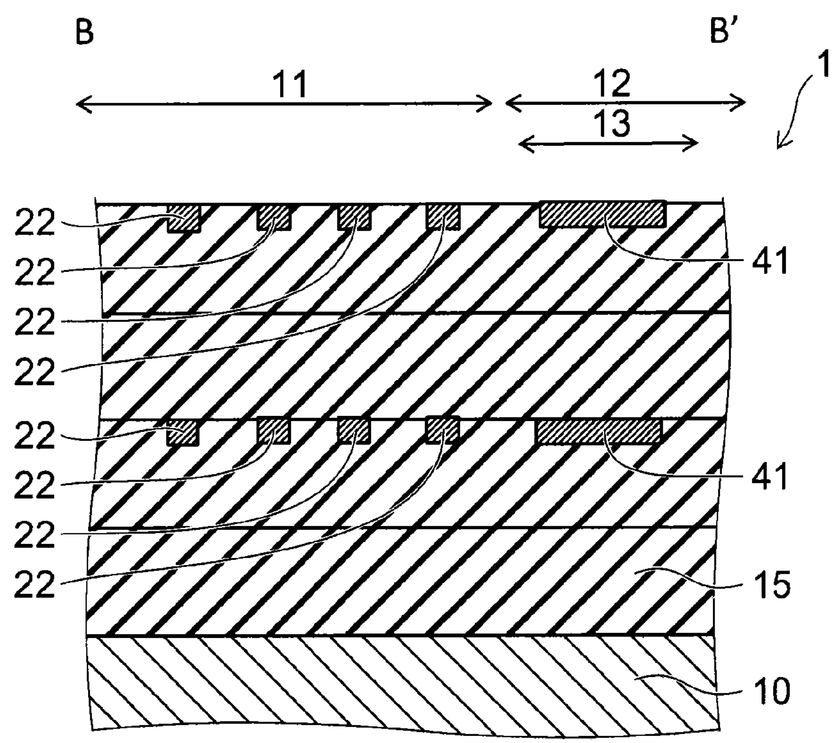
FIG. 3 is a sectional view taken along line B-B' shown in FIG. 1.

FIG. 3 is a sectional view taken along line B-B' shown in FIG. 1.

Figure 4:
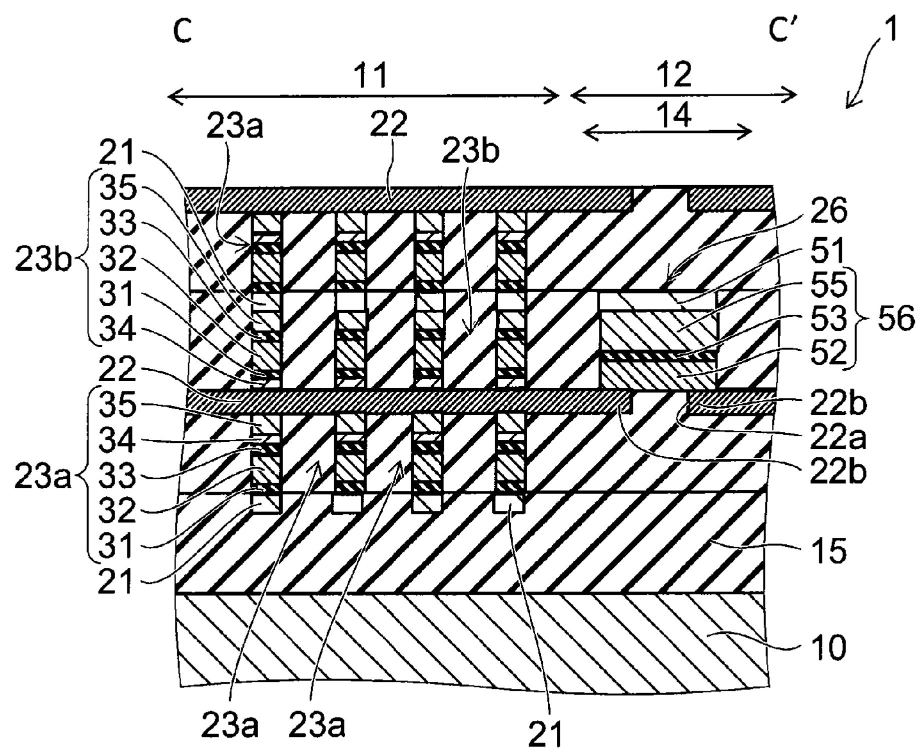
FIG. 4 is a sectional view taken along line C-C' shown in FIG. 1.
Figure 4:
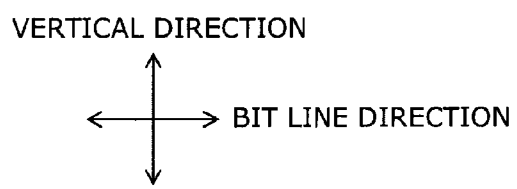

FIG. 4 is a sectional view taken along line C-C' shown in FIG. 1.

For convenience of illustration, in FIG. 1, insulating portions are not shown, and only conductive portions are shown.

As shown in FIGS. 1 to 4, the memory device 1 according to the embodiment includes a silicon substrate 10. On the upper surface of the silicon substrate 10, a memory cell array region 11 is defined, and a peripheral circuit region 12 is defined therearound. In FIG. 1, the outside of the memory cell array region 11 is the peripheral circuit region 12. The boundary between the memory cell array region 11 and the peripheral circuit region 12 is indicated by a double-dot dashed line. In the neighborhood of the memory cell array region 11 in the peripheral circuit region 12, at a position located in one direction (hereinafter referred to as "word line direction") parallel to the upper surface of the silicon substrate 10 as viewed from the memory cell array region 11, a band-shaped word line transistor region 13 is defined along the outer edge of the memory cell array region 11. Furthermore, in the neighborhood of the memory cell array region 11 in the peripheral circuit region 12, at a position located in the direction (hereinafter referred to as "bit line direction") orthogonal to the word line direction as viewed from the memory cell array region 11, a band-shaped bit line transistor region 14 is defined along the outer edge of the memory cell array region 11.

On the silicon substrate 10, word line wiring layers and bit line wiring layers are alternately stacked along the direction (hereinafter referred to as "vertical direction") perpendicular to the upper surface of the silicon substrate 10. The word line wiring layer is made of a plurality of word lines 21. The bit line wiring layer is made of a plurality of bit lines 22. The word line 21 extends in the word line direction. The bit line 22 extends in the bit line direction. Each word line 21 and each bit line 22 are skew to each other. However, as viewed from above, each word line 21 and each bit line 22 cross in the memory cell array region 11. In the word line transistor region 13, a gate line 41 extending in the bit line direction is provided in the bit line wiring layer. In the bit line transistor region 14, a gate line 51 extending in the word line direction is provided in the word line wiring layer other than the lowermost layer. The word line 21, the bit line 22, the gate line 41, and the gate line 51 each include a metal layer having the same composition and the same thickness. In FIGS. 2 to 4, two word line wiring layers and two bit line wiring layers are shown. However, the number of stacked layers of the memory device 1 is not limited thereto, but more wiring layers may be stacked.

In the memory cell array region 11, among the portions between the word line 21 and the bit line 22, in the portion with a word line 21 placed immediately therebelow and a bit line 22 placed immediately thereabove, a pillar 23*a* is provided. Furthermore, in the portion with a bit line 22 placed immediately therebelow and a word line 21 placed immediately thereabove, a pillar 23*b* is provided. The pillars 23*a* and 23*b* are each connected between the word line 21 and the bit line 22, and shaped like e.g. a column extending in the vertical direction.

In the pillar 23*a*, from the word line 21 therebelow toward the bit line 22 thereabove, a silicon oxide layer 31, a polysilicon layer 32, a silicon oxide layer 33, an ion source metal electrode 34, and a CMP (chemical mechanical polishing) stopper electrode 35 are stacked in this order.

In the pillar 23*b*, from the bit line 22 therebelow toward the word line 21 thereabove, an ion source metal electrode 34, a silicon oxide layer 31, a polysilicon layer 32, a silicon oxide layer 33, and a CMP stopper electrode 35 are stacked in this order. The polysilicon layer 32 is formed from e.g. non-doped silicon with the crystal structure being a polycrystalline structure. The ion source metal electrode 34 is formed from e.g. silver (Ag).

The pillars 23*a* and 23*b* are arranged like a matrix along the word line direction and the bit line direction, respectively. The pillars 23*a* and 23*b* each constitute a resistance change memory cell 24.

As shown in FIG. 2, the word line 21 extends from the memory cell array region 11 in the word line direction, and divided in the word line transistor region 13. On the word line 21, astride the divided portion 21*a* of the word line 21, a polysilicon layer 42, a silicon oxide layer 43, and a CMP stopper electrode 45 are stacked in this order to form a stacked body 46. Both end portions in the word line direction on the lower surface of the polysilicon layer 42 are in contact with a pair of end portions 21*b* sandwiching the divided portion 21*a* of the word line 21, respectively. The upper surfaces of the CMP stopper electrodes 45 are commonly connected to the gate line 41. In other words, the gate line 41 is placed on the opposite side of the contact surface with the word line 21 as viewed from the polysilicon layer 42. In the portion of the word line 21 in contact with the polysilicon layer 42, the word line direction central portion is divided.

The thickness of the polysilicon layer 42 is equal to the thickness of the polysilicon layer 32. The thickness of the silicon oxide layer 43 is equal to the thickness of the silicon oxide layer 33. The thickness of the gate line 41 is equal to the thickness of the bit line 22. As described later in detail, these films are formed simultaneously. This makes the film characteristics thereof generally same. The film characteristics made same include, besides film thickness, e.g. composition and density.

The composition and density of the CMP stopper electrode 45 are equal to the composition and density of the CMP stopper electrode 35. However, the CMP stopper electrode 45 is thicker than the CMP stopper electrode 35.

The portion of the word line 21 in contact with the polysilicon layer 42 functions as a source/drain layer. The polysilicon layer 42 functions as a channel. The silicon oxide layer 43 functions as a gate insulating film. The CMP stopper electrode 45 functions as a gate electrode. Thus, a word line driver transistor 25 is configured. The gate line 41 functions as an extraction wiring for the gate electrode. Thus, the memory cell 24 formed in the pillar 23*a* is formed on the same word line 21 as the word line driver transistor 25.

As shown in FIG. 4, the bit line 22 extends from the memory cell array region 11 in the bit line direction, and divided in the bit line transistor region 14. On the bit line 22, astride the divided portion 22*a* of the bit line 22, a polysilicon layer 52, a silicon oxide layer 53, and a CMP stopper electrode 55 are stacked in this order to form a stacked body 56. Both end portions in the bit line direction on the lower surface of the polysilicon layer 52 are in contact with a pair of end portions 22*b* sandwiching the divided portion 22*a* of the bit line 22, respectively. The upper surfaces of the CMP stopper electrodes 55 are commonly connected to the gate line 51. In other words, the gate line 51 is placed on the opposite side of the contact surface with the bit line 22 as viewed from the polysilicon layer 52. In the portion of the bit line 22 in contact with the polysilicon layer 52, the bit line direction central portion is divided.

The thickness of the polysilicon layer 52 is equal to the thickness of the polysilicon layer 32. The thickness of the silicon oxide layer 53 is equal to the thickness of the silicon oxide layer 33. The thickness of the gate line 51 is equal to the thickness of the word line 21. As described later in detail, these films are formed simultaneously. This makes the film characteristics thereof generally the same. The film characteristics made the same include, besides film thickness, e.g. composition and density.

The composition and density of the CMP stopper electrode 55 are equal to the composition and density of the CMP stopper electrode 35. However, the CMP stopper electrode 55 is thicker than the CMP stopper electrode 35.

The portion of the bit line 22 in contact with the polysilicon layer 52 functions as a source/drain layer. The polysilicon layer 52 functions as a channel. The silicon oxide layer 53 functions as a gate insulating film. The CMP stopper electrode 55 functions as a gate electrode. Thus, a bit line driver transistor 26 is configured. The gate line 51 functions as an extraction wiring for the gate electrode. Thus, the memory cell 24 formed in the pillar 23*b* is formed on the same bit line 22 as the bit line driver transistor 26. In the following, the word line driver transistor 25 and the bit line driver transistor 26 are also collectively referred to as "driver transistors".

Furthermore, on the silicon substrate 10, an interlayer insulating film 15 made of e.g. silicon oxide is provided. The interlayer insulating film 15 covers the aforementioned members, i.e., the word line 21, the bit line 22, the memory cell 24, the word line driver transistor 25, and the bit line driver transistor 26.

Thus, the word line driver transistor 25 is placed in the word line transistor region 13 for each layer including the pillar 23*a* and the vertically adjacent bit line 22 and word line 21. The word line driver transistors 25 placed in each word line transistor region 13 are arranged like a matrix along the plane spread in the bit line direction and the vertical direction.

Likewise, the bit line driver transistor 26 is placed in the bit line transistor region 14 for each layer including the pillar 23*b* and the vertically adjacent word line 21 and bit line 22. The bit line driver transistors 26 placed in each bit line transistor region 14 are arranged like a matrix along the plane spread in the word line direction and the vertical direction.

In the following, the material of each layer is illustrated.

As described above, in the embodiment, the resistance change film of the memory cell 24 is made of a stacked film in which a silicon oxide layer 31, a polysilicon layer 32, and a silicon oxide layer 33 are stacked in this order. However, the resistance change film is not limited thereto. The resistance change film can be configured as e.g. a monolayer film made of one layer of a silicon oxide layer, silicon oxynitride layer, polysilicon layer, amorphous silicon layer, germanium layer, silicon germanium layer, and compound semiconductor layer, or a stacked film with a plurality of these layers stacked therein.

In the embodiment, the channel member of the word line driver transistor 25 and the bit line driver transistor 26 are configured as the polysilicon layers 42 and 52. However, the channel member is not limited thereto. The channel member may be configured as e.g. a crystalline silicon layer, amorphous silicon layer, germanium layer, silicon germanium layer, or compound semiconductor layer. The crystalline silicon layer is e.g. a crystalline silicon layer formed by deposition technique, and may be either a monocrystalline silicon layer or polycrystalline silicon layer. Furthermore, the channel member may be doped with impurity to control the threshold voltage of the driver transistor.

Furthermore, in the embodiment, the gate insulating film of the driver transistor is configured as a silicon oxide layer. However, the gate insulating film is not limited thereto. The gate insulating film can be configured as e.g. a monolayer film made of one layer of a silicon oxide layer, silicon oxynitride layer, and high dielectric insulating layer, or a stacked film with a plurality of these layers stacked therein.

The material of the ion source metal electrode 34 can be based on, besides silver (Ag), one metal selected from the group consisting of gold (Au), titanium (Ti), nickel (Ni), cobalt (Co), aluminum (Al), iron (Fe), chromium (Cr), copper (Cr), hafnium (Hf), platinum (Pt), ruthenium (Ru), zirconium (Zr), and iridium (Ir), or an alloy of two or more of these metals, or nitride, carbide, or chalcogenide material thereof.

The word line 21, the bit line 22, the gate lines 41 and 51, and the CMP stopper electrodes 35, 45, and 55 can be configured as e.g. a monolayer made of tungsten (W), molybdenum (Mo), or titanium nitride (Ti), or a stacked film thereof. The CMP stopper electrode 35 doubles as an extraction electrode for the memory cell 24. The CMP stopper electrodes 45 and 55 constitute the gate electrodes of the word line driver transistor 25 and the bit line driver transistor 26, respectively. Thus, the work function thereof may be optimized to control the threshold voltage of the driver transistor.

Thus, in the embodiment, the material of the polysilicon layer 32 constituting part of the resistance change film of the memory cell 24 is made in common with the material of the polysilicon layer 42 constituting the channel member of the word line driver transistor 25 and the polysilicon layer 52 constituting the channel member of the bit line driver transistor 26. The material of the silicon oxide layer 33 constituting part of the resistance change film of the memory cell 24 is made in common with the material of the silicon oxide layer 43 constituting the gate insulating film of the word line driver transistor 25 and the silicon oxide layer 53 constituting the gate insulating film of the bit line driver transistor 26. The material of the CMP stopper electrode 35 constituting the extraction electrode of the memory cell 24 is made in common with the material of the CMP stopper electrode 45 constituting the gate electrode of the word line driver transistor 25 and the CMP stopper electrode 55 constituting the gate electrode of the bit line driver transistor 26.

Next, the dimension of each portion is illustrated.

The diameter of the pillars 23*a* and 23*b* is e.g. approximately 5-100 nm. The thickness of each layer constituting the resistance change film is e.g. approximately 1-50 nm. The gate length of the driver transistor is e.g. approximately 50 nm to 1 μm. The thickness of the gate insulating film is e.g. approximately 1-10 nm. The thickness of the channel member is e.g. approximately 3-50 nm.

Next, the operation of the memory device 1 according to the embodiment is described.

To a memory cell 24, a forward voltage with the bit line 22 being positive and the word line 21 being negative is applied. Thus, part of the metal atoms, e.g. silver atoms, contained in the ion source metal electrode 34 turn to cations and migrate into the resistance change film made of the silicon oxide layer 33, the polysilicon layer 32, and the silicon oxide layer 31. Then, these cations are combined with electrons supplied from the word line 21, and precipitated as metal atoms. Thus, a filament (not shown) is formed in the resistance change film, and the resistance change film turns to the low resistance state (ON state). On the other hand, by application of a reverse voltage with the bit line 22 being negative and the word line 21 being positive, at least part of the metal atoms constituting the filament turn to cations and return to the ion source metal electrode 34. Thus, the filament is divided, and the resistance change film turns to the high resistance state (OFF state).

Here, the timing of applying a potential to the word line 21 is controlled by the word line driver transistor 25. More specifically, by applying a positive potential to the gate line 41, electrons are collected in the portion of the polysilicon layer 42 near the silicon oxide layer 43. Thus, a current flows in the polysilicon layer 42. As a result, the word line driver transistor 25 is turned on, and the word line 21 is brought into conduction. Likewise, the timing of applying a potential to the bit line 22 is controlled by the bit line driver transistor 26. More specifically, by applying a positive potential to the gate line 51, electrons are collected in the portion of the polysilicon layer 52 near the silicon oxide layer 53. Thus, a current flows in the polysilicon layer 52. As a result, the bit line driver transistor 26 is turned on, and the bit line 22 is brought into conduction.

Next, a method for manufacturing the memory device 1 according to the embodiment is described.

FIGS. 5A to 12B illustrate the method for manufacturing a memory device according to the embodiment.

Figure 5A:
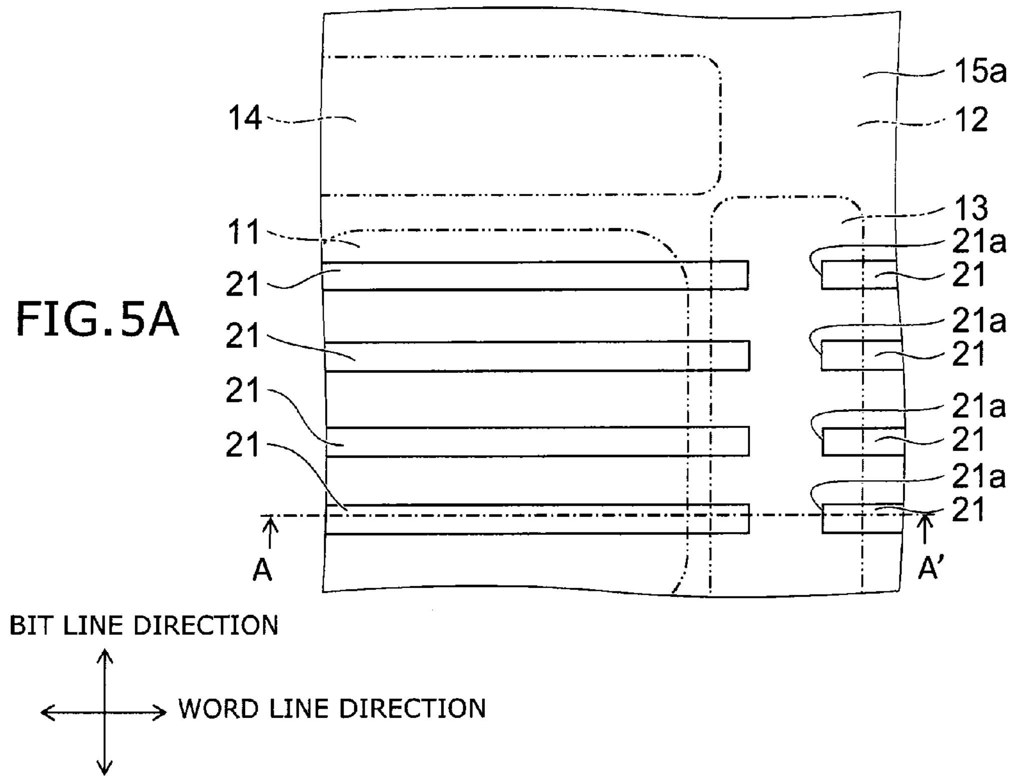
FIG. 5A is a plan view illustrating a method for manufacturing the memory device according to the first embodiment.
Figure 5B:
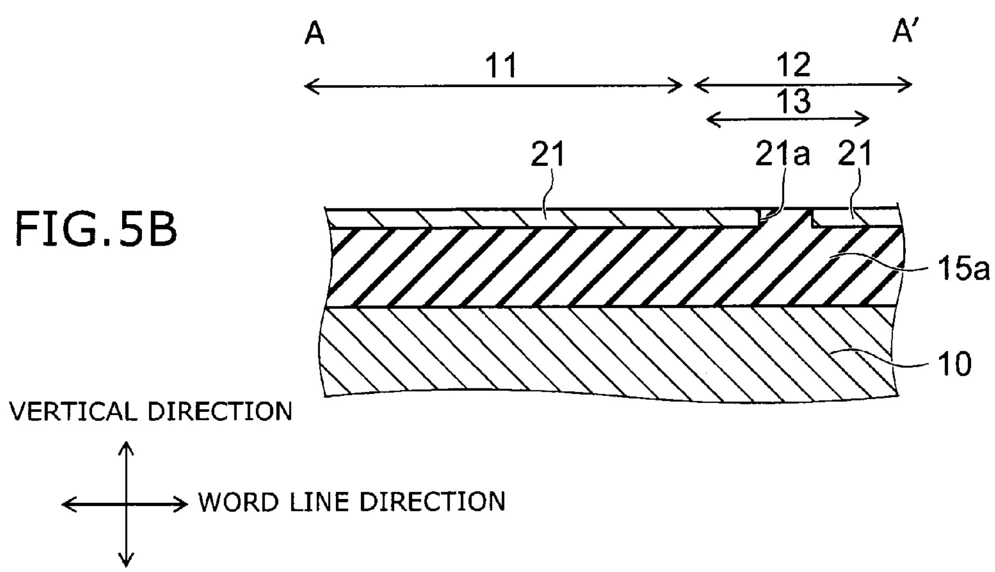
FIG. 5B is a sectional view taken along line A-A' shown in FIG. 5A.

First, as shown in FIGS. 5A and 5B, a silicon substrate 10 is prepared. On the upper surface of the silicon substrate 10, a memory cell array region 11 and a peripheral circuit region 12 are defined. In the peripheral circuit region 12, a word line transistor region 13 is defined on one side in the word line direction of the memory cell array region 11, and a bit line transistor region 14 is defined on one side in the bit line direction.

An interlayer insulating film 15*a* is deposited on the silicon substrate 10. A plurality of word lines 21 extending in the word line direction are formed in an upper portion of the interlayer insulating film 15*a*. In the portion of each word line 21 located in the word line transistor region 13, one divided portion 21*a* is formed. Here, the interlayer insulating film 15*a* shown in FIG. 5B is part of the interlayer insulating film 15 shown in FIGS. 2 to 4. In the following, likewise, part of the interlayer insulating film 15 is denoted as interlayer insulating film 15*a*-15*c*.

Figure 6A:
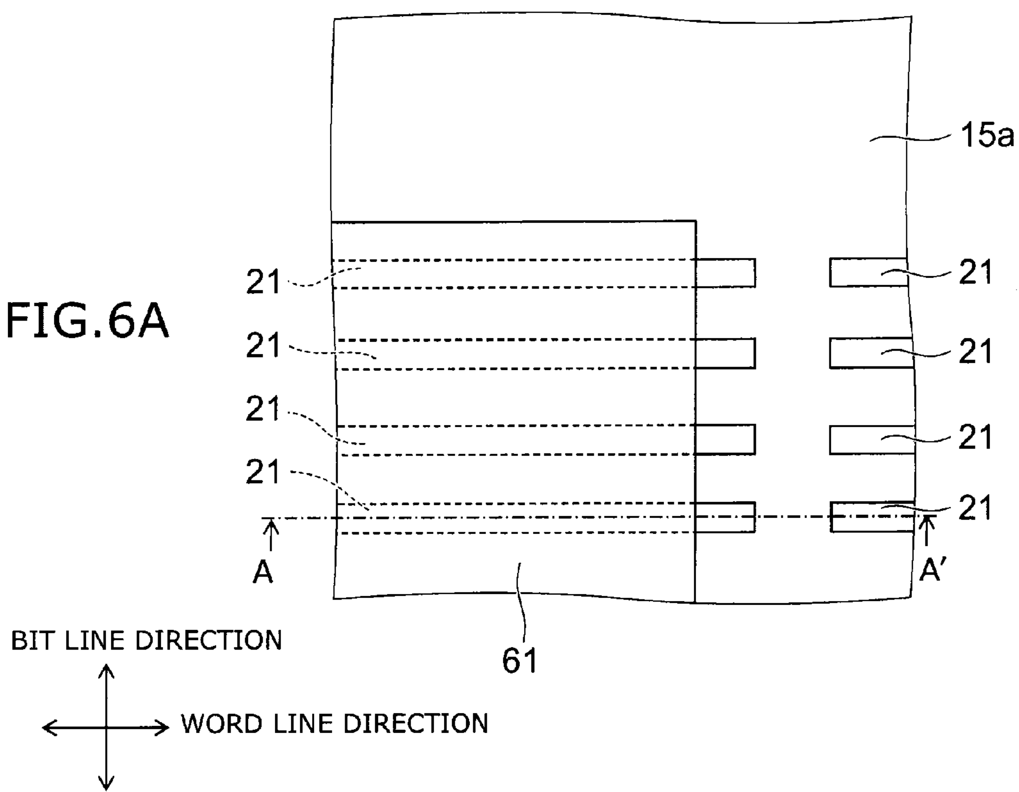
FIG. 6A is a plan view illustrating the method for manufacturing the memory device according to the first embodiment.
Figure 6B:
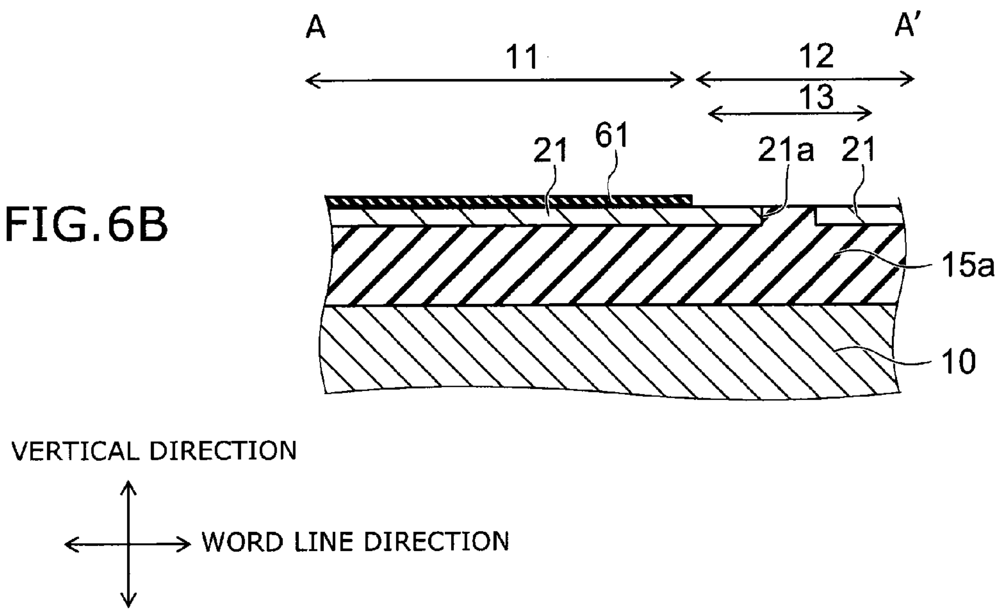
FIG. 6B is a sectional view taken along line A-A' shown in FIG. 6A.

Next, as shown in FIGS. 6A and 6B, on the entire surface of the interlayer insulating film 15*a* and the word lines 21, a silicon oxide layer 61 is deposited. Then, the silicon oxide layer 61 is patterned and left only in the memory cell array region 11.

Figure 7A:
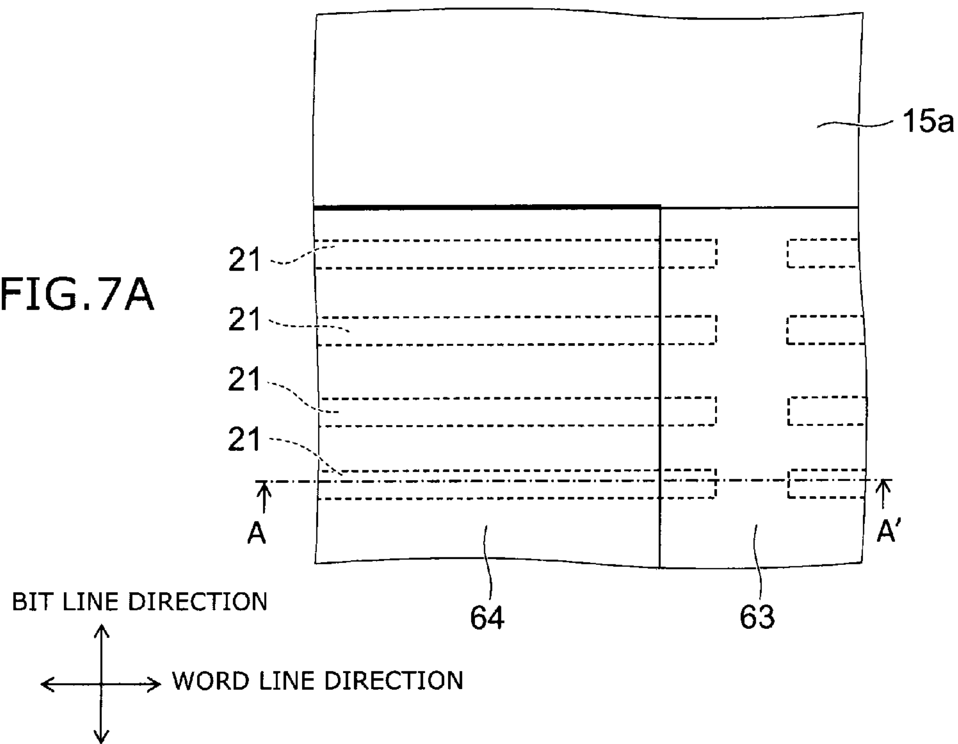
FIG. 7A is a plan view illustrating the method for manufacturing the memory device according to the first embodiment.
Figure 7B:
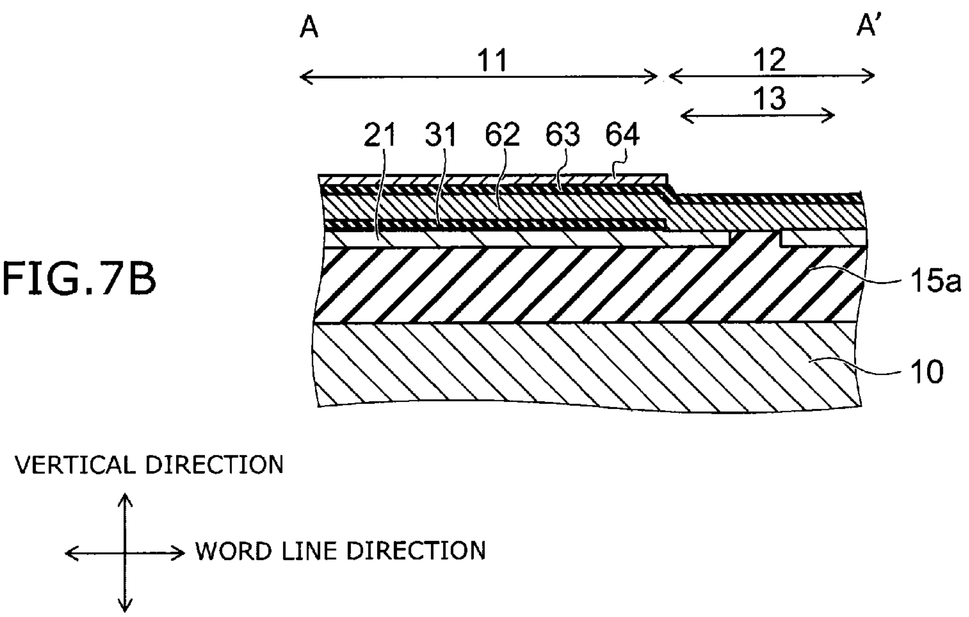
FIG. 7B is a sectional view taken along line A-A' shown in FIG. 7A.

Next, as shown in FIGS. 7A and 7B, polysilicon is deposited on the entire surface to form a polysilicon layer 62. Here, instead of depositing polysilicon, amorphous silicon may be deposited and then crystallized by high temperature heat treatment to form a polysilicon layer. Polysilicon or amorphous silicon can be deposited by e.g. low pressure CVD (chemical vapor deposition) technique or plasma CVD technique.

Next, a silicon oxide layer 63 and an ion source metal electrode 64 are deposited on the entire surface. Next, the ion source metal electrode 64 is patterned. Thus, the ion source metal electrode 64 is removed from the peripheral circuit region 12 and left in the memory cell array region 11. Next, the silicon oxide layer 63 and the polysilicon layer 62 are patterned. Thus, the silicon oxide layer 63 and the polysilicon layer 62 are removed from the peripheral circuit region 12 other than the word line transistor region 13, and left in the memory cell array region 11 and the word line transistor region 13.

Figure 8A:
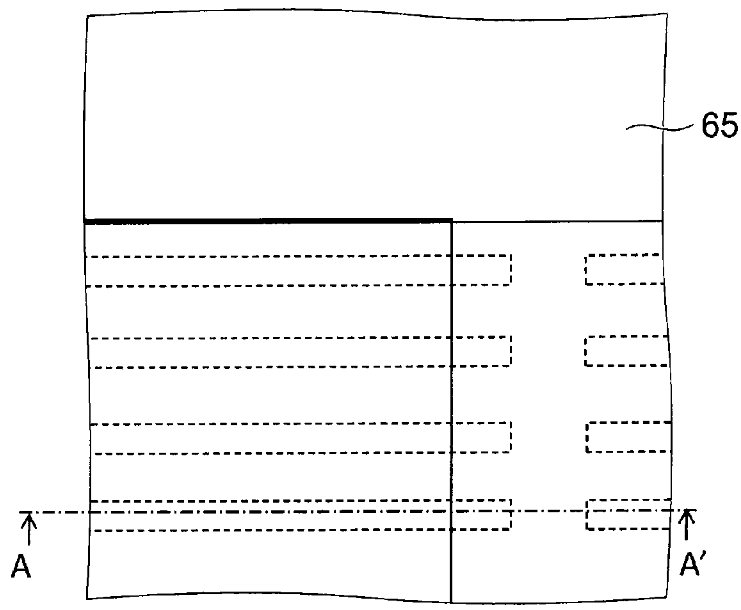
FIG. 8A is a plan view illustrating the method for manufacturing the memory device according to the first embodiment.
Figure 8B:
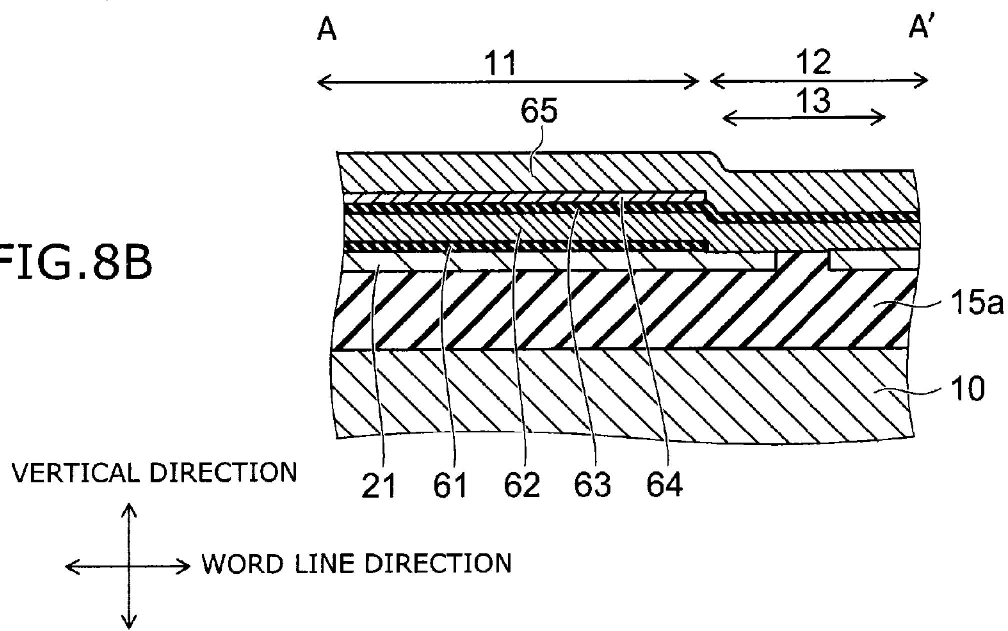
FIG. 8B is a sectional view taken along line A-A' shown in FIG. 8A.
Figure 8B:
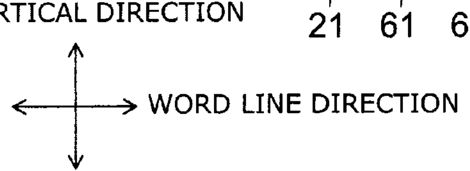

Next, as shown in FIGS. 8A and 8B, a CMP stopper electrode 65 is deposited on the entire surface.

Figure 9A:
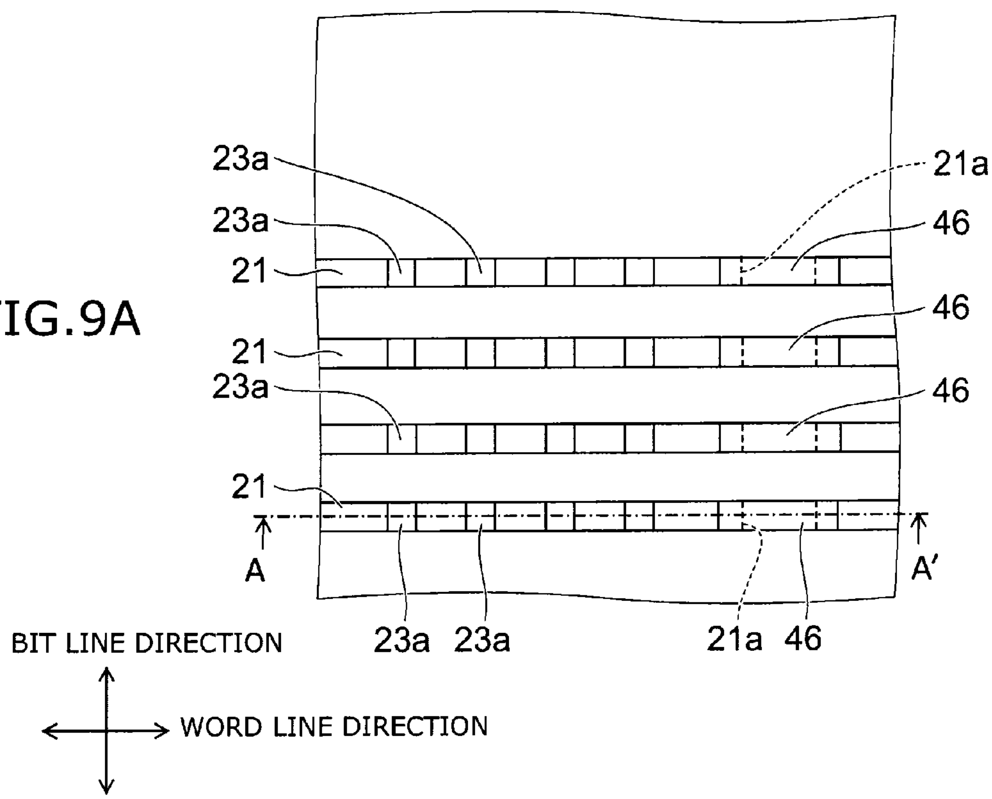
FIG. 9A is a plan view illustrating the method for manufacturing the memory device according to the first embodiment.
Figure 9B:
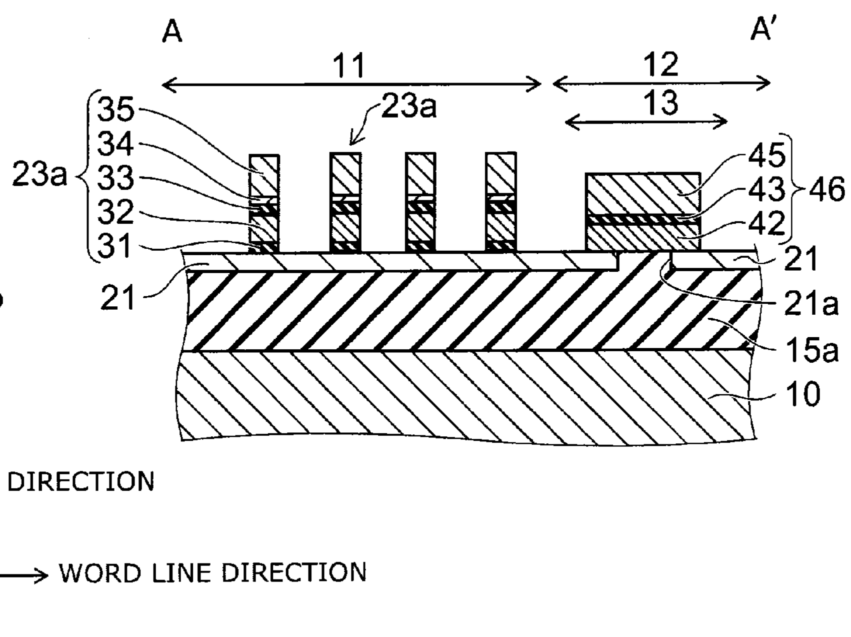
FIG. 9B is a sectional view taken along line A-A' shown in FIG. 9A.

Next, as shown in FIGS. 9A and 9B, the CMP stopper electrode 65, the ion source metal electrode 64, the silicon oxide layer 63, and the polysilicon layer 62 are collectively patterned. Thus, in the memory cell array region 11, the CMP stopper electrode 65 constitutes a CMP stopper electrode 35, the ion source metal electrode 64 constitutes an ion source metal electrode 34, the silicon oxide layer 63 constitutes a silicon oxide layer 33, the polysilicon layer 62 constitutes a polysilicon layer 32, and the silicon oxide layer 61 constitutes a silicon oxide layer 31. Accordingly, a plurality of pillars 23*a* are formed. The pillars 23*a* are placed immediately above the word lines 21, and arranged like a matrix along the word line direction and the bit line direction. In each word line transistor region 13 of the peripheral circuit region 12, the CMP stopper electrode 65 constitutes a CMP stopper electrode 45, the silicon oxide layer 63 constitutes a silicon oxide layer 43, and the polysilicon layer 62 constitutes a polysilicon layer 42. Accordingly, a plurality of stacked bodies 46 are formed. The stacked bodies 46 are arranged in a line along the bit line direction. Each stacked body 46 is shaped like a generally rectangular solid, and its longitudinal direction is the word line direction.

Figure 10A:
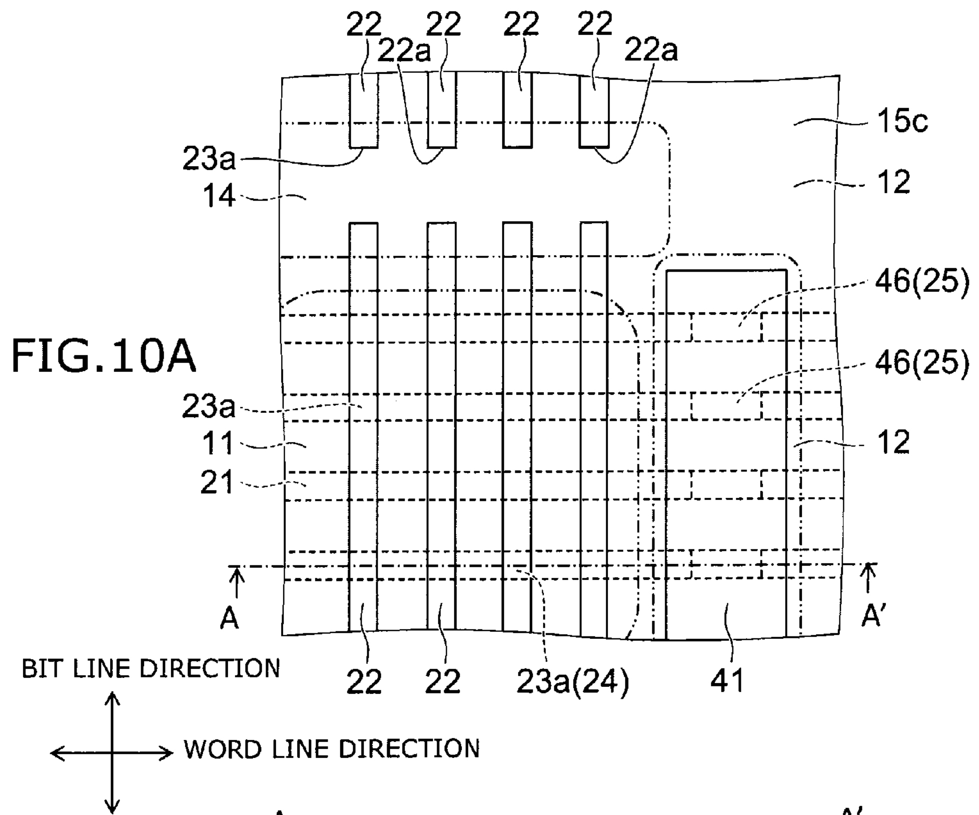
FIG. 10A is a plan view illustrating the method for manufacturing the memory device according to the first embodiment.
Figure 10B:
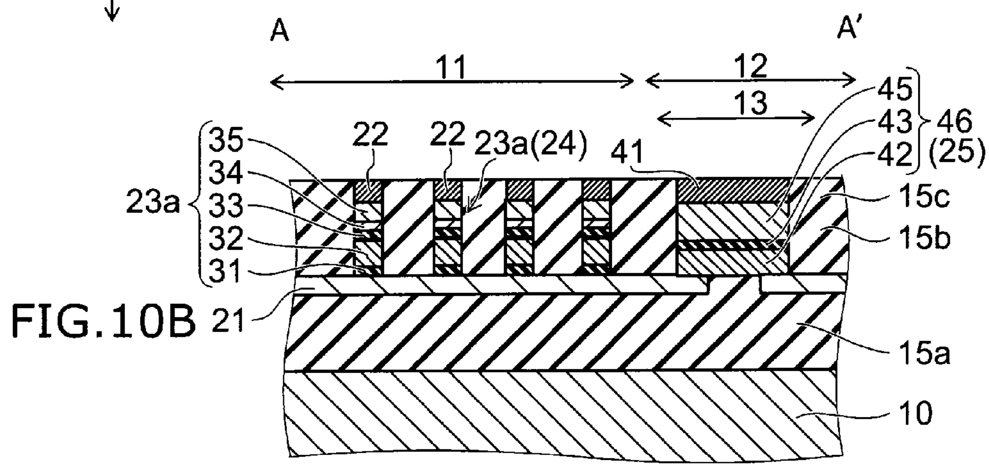
FIG. 10B is a sectional view taken along line A-A' shown in FIG. 10A.

Next, as shown in FIGS. 10A and 10B, an insulating material is deposited. CMP is performed using the CMP stopper electrodes 35 and 45 as a stopper to planarize the upper surface. Thus, an interlayer insulating film 15*b* is formed and embedded among the pillars 23*a* and the stacked bodies 46. On the upper surface of the interlayer insulating film 15*b*, the CMP stopper electrodes 35 and 45 are exposed.

Next, an interlayer insulating film 15*c* is formed on the interlayer insulating film 15*b*. A plurality of bit lines 22 and a gate line 41 are collectively formed in the interlayer insulating film 15*c*. At this time, the bit line 22 is formed so as to extend in the bit line direction, to pass through the memory cell array region 11 and the bit line transistor region 14, and to be in contact with the CMP stopper electrode 35 of the pillar 23*a*. A divided portion 22*a* is formed in the bit line transistor region 14. The gate line 41 is formed so as to extend in the bit line direction, to pass through the word line transistor region 13, and to be in contact with the CMP stopper electrode 45.

As a result, in the memory cell array region 11, a memory cell 24 is formed for each of the pillars 23*a* arranged like a matrix. In the word line transistor region 13, a word line driver transistor 25 is formed for each of the stacked bodies 46 arranged in a line along the bit line direction.

Figure 11A:
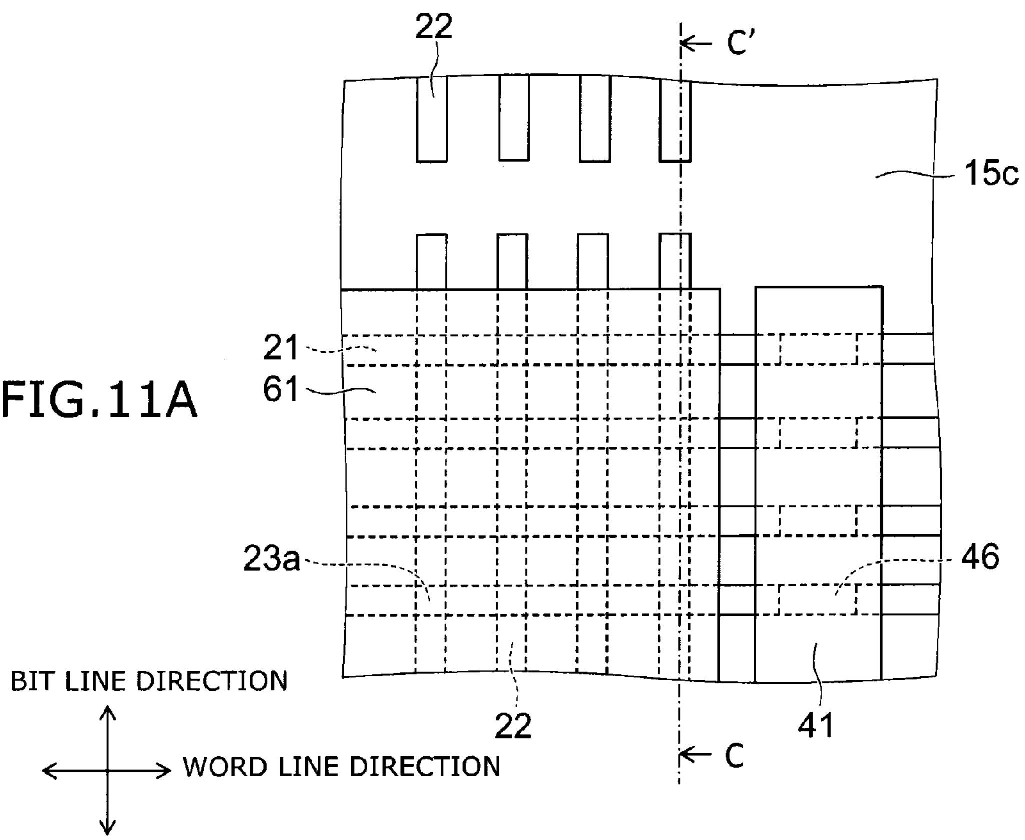
FIG. 11A is a plan view illustrating a method for manufacturing a memory device according to the first embodiment.
Figure 11B:
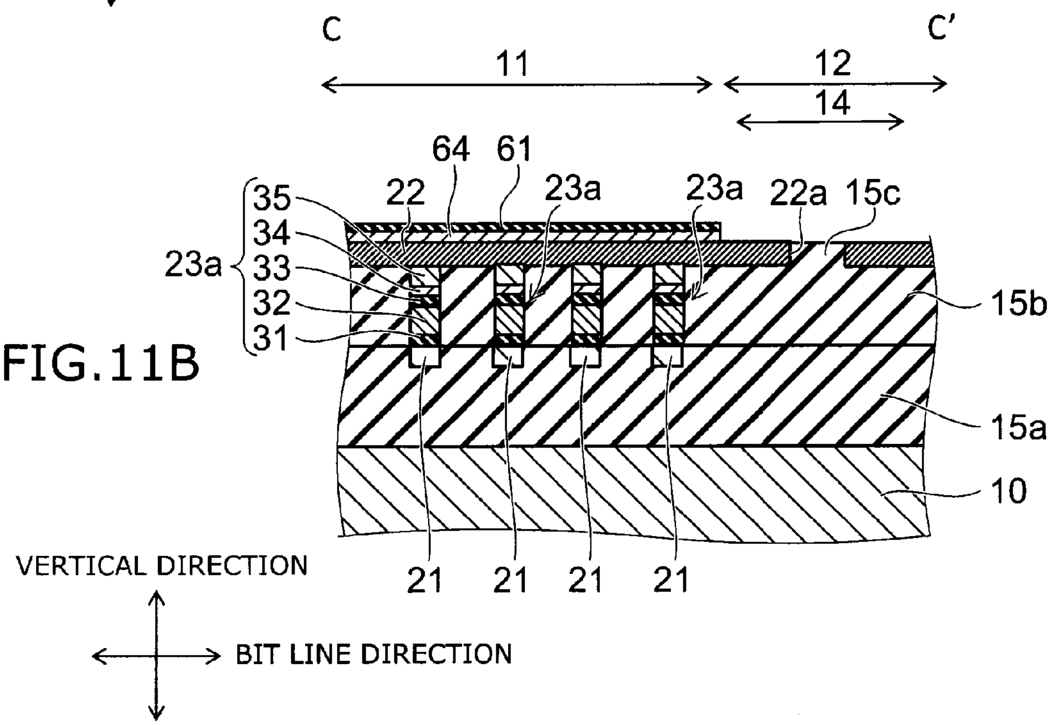
FIG. 11B is a sectional view taken along line C-C' shown in FIG. 11A.

Next, as shown in FIGS. 11A and 11B, an ion source metal electrode 64 and a silicon oxide layer 61 are deposited on the entire surface. The ion source metal electrode 64 and the silicon oxide layer 61 are patterned and left only in the memory cell array region 11.

Figure 12A:
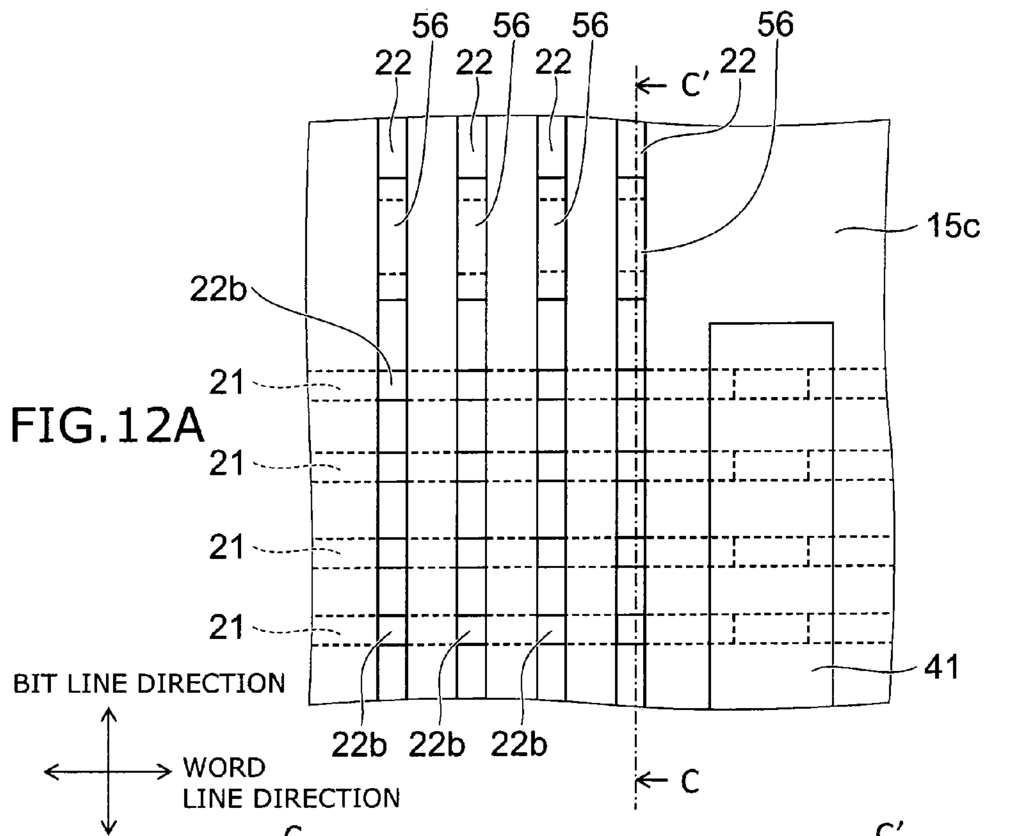
FIG. 12A is a plan view illustrating the method for manufacturing the memory device according to the first embodiment.
Figure 12B:
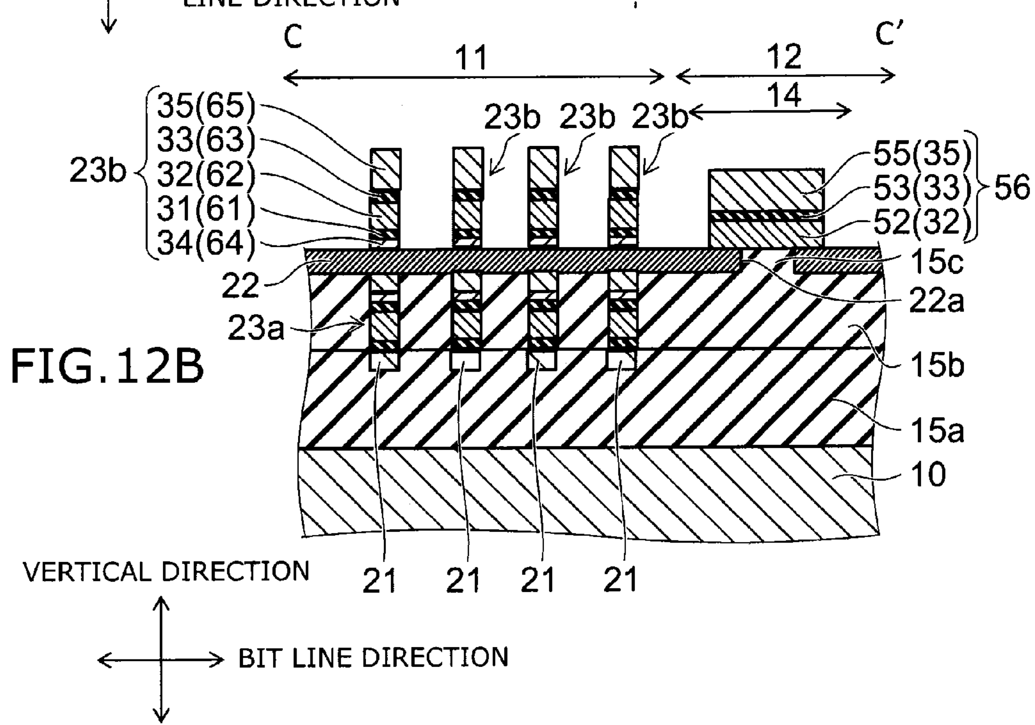
FIG. 12B is a sectional view taken along line C-C' shown in FIG. 12A.

Next, as shown in FIGS. 12A and 12B, a polysilicon layer 62, a silicon oxide layer 63, and a CMP stopper electrode 65 are deposited on the entire surface. Next, the CMP stopper electrode 65, the silicon oxide layer 63, the polysilicon layer 62, the silicon oxide layer 61, and the ion source metal electrode 64 are collectively patterned. Thus, in the memory cell array region 11, the CMP stopper electrode 65 constitutes a CMP stopper electrode 35, the silicon oxide layer 63 constitutes a silicon oxide layer 33, the polysilicon layer 62 constitutes a polysilicon layer 32, the silicon oxide layer 61 constitutes a silicon oxide layer 31, and the ion source metal electrode 64 constitutes an ion source metal electrode 34. Accordingly, a plurality of pillars 23*b* are formed. The pillars 23*b* are placed immediately above the bit lines 22, and arranged like a matrix along the word line direction and the bit line direction. In each bit line transistor region 14 of the peripheral circuit region 12, the CMP stopper electrode 65 constitutes a CMP stopper electrode 55, the silicon oxide layer 63 constitutes a silicon oxide layer 53, and the polysilicon layer 62 constitutes a polysilicon layer 52. Accordingly, a plurality of stacked bodies 56 are formed. The stacked bodies 56 are arranged in a line along the word line direction. Each stacked body 56 is shaped like a generally rectangular solid, and its longitudinal direction is the bit line direction.

Next, as shown in FIGS. 1 to 5B, an insulating material is deposited. CMP is performed using the CMP stopper electrodes 35 and 55 as a stopper to planarize the upper surface.

Thus, an interlayer insulating layer 15 is embedded among the pillars 23*b* and the stacked bodies formed in the bit line transistor region 14. Next, an interlayer insulating film 15 is further deposited. Word lines 21 and a gate line 51 extending in the word line direction are formed inside the interlayer insulating film 15. Thus, in the memory cell array region 11, a memory cell 24 is formed for each of the pillars 23*b*. In the bit line transistor region 14, a bit line driver transistor 26 is formed for each of the stacked bodies 56.

Subsequently, likewise, formation of pillars 23*a* and word line driver transistors 25, and formation of pillars 23*b* and bit line driver transistors 26 are repeated. Thus, the memory device 1 is manufactured.

Next, the effect of the embodiment is described.

In the embodiment, in the peripheral circuit region 12, the channel region of the word line driver transistor 25 and the bit line driver transistor 26 is formed not in the silicon substrate 10 but in the polysilicon layers 42 and 52. Thus, a word line driver transistor 25 can be formed for each layer including the pillar 23*a*, and a bit line driver transistor 26 can be formed for each layer including the pillar 23*b*. As a result, in the memory cell array region 11, the word line driver transistor 25 and the bit line driver transistor 26 can be stacked upward in tune with the upward stacking of the memory cells 24. Thus, even if the number of stacked layers of the memory cells 24 is increased, there is no increase in the area of the word line transistor region 13 and the bit line transistor region 14, and there is also no increase the area occupied by the peripheral circuit region 12 on the chip. Accordingly, by stacking the memory cells 24, the degree of integration of memory cells can be increased in the memory device 1 as a whole.

In the embodiment, in the step shown in FIGS. 9A and 9B, the CMP stopper electrodes 35 and 45 are simultaneously formed by patterning the CMP stopper electrode 65. The silicon oxide layers 33 and 43 are simultaneously formed by patterning the silicon oxide layer 63. The polysilicon layers 32 and 42 are simultaneously formed by patterning the polysilicon layer 62. In the step shown in FIGS. 10A and 10B, the bit lines 22 and the gate line 41 are simultaneously formed.

Furthermore, in the step shown in FIGS. 12A and 12B, the CMP stopper electrodes 35 and 55 are simultaneously formed by patterning the CMP stopper electrode 65. The silicon oxide layers 33 and 53 are simultaneously formed by patterning the silicon oxide layer 63. The polysilicon layers 32 and 52 are simultaneously formed by patterning the polysilicon layer 62. Then, the word lines 21 and the gate line 51 are simultaneously formed.

Thus, according to the embodiment, part of the resistance change film of memory cells 24 and the extraction electrode, the channel member of the driver transistor, and part of the gate insulating film and the gate electrode in each level can be formed by common steps. Accordingly, even if the driver transistors are stacked upward, increase in the number of steps is small. Thus, increase in manufacturing cost can be suppressed.

Second Embodiment

Next, a second embodiment is described.

Figure 13:
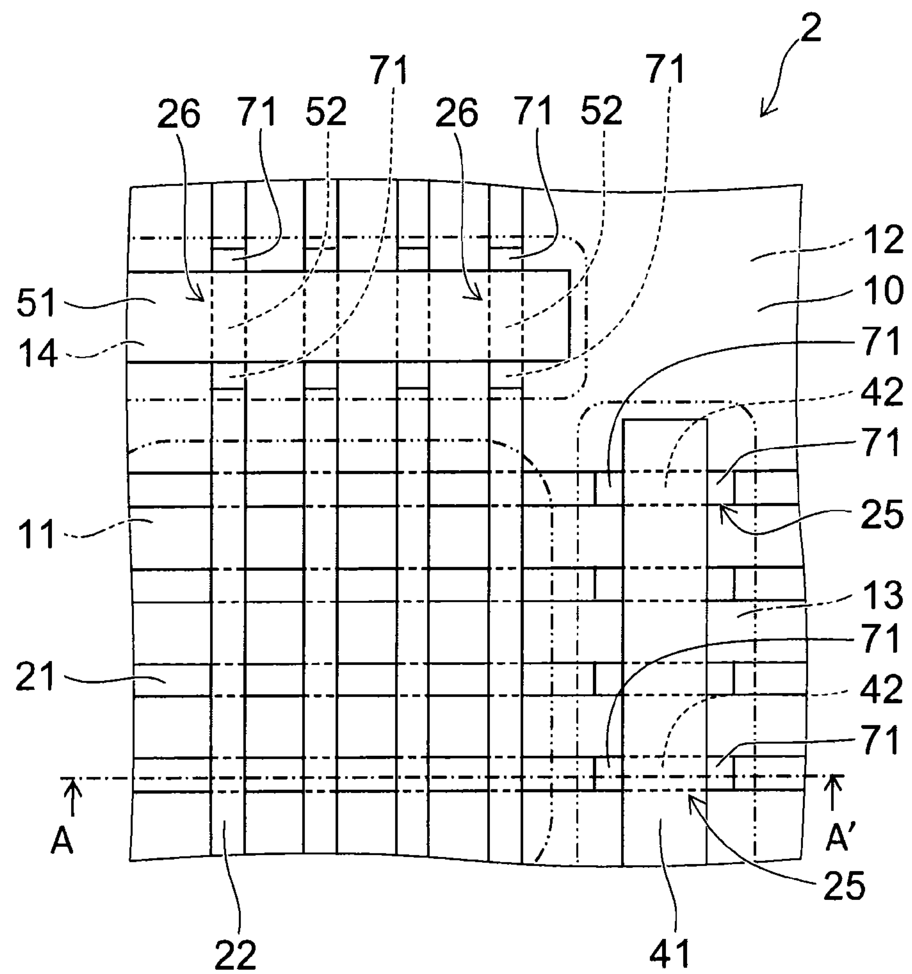
FIG. 13 is a plan view illustrating a memory device according to a second embodiment.

FIG. 13 is a plan view illustrating a memory device according to the embodiment.

Figure 14:
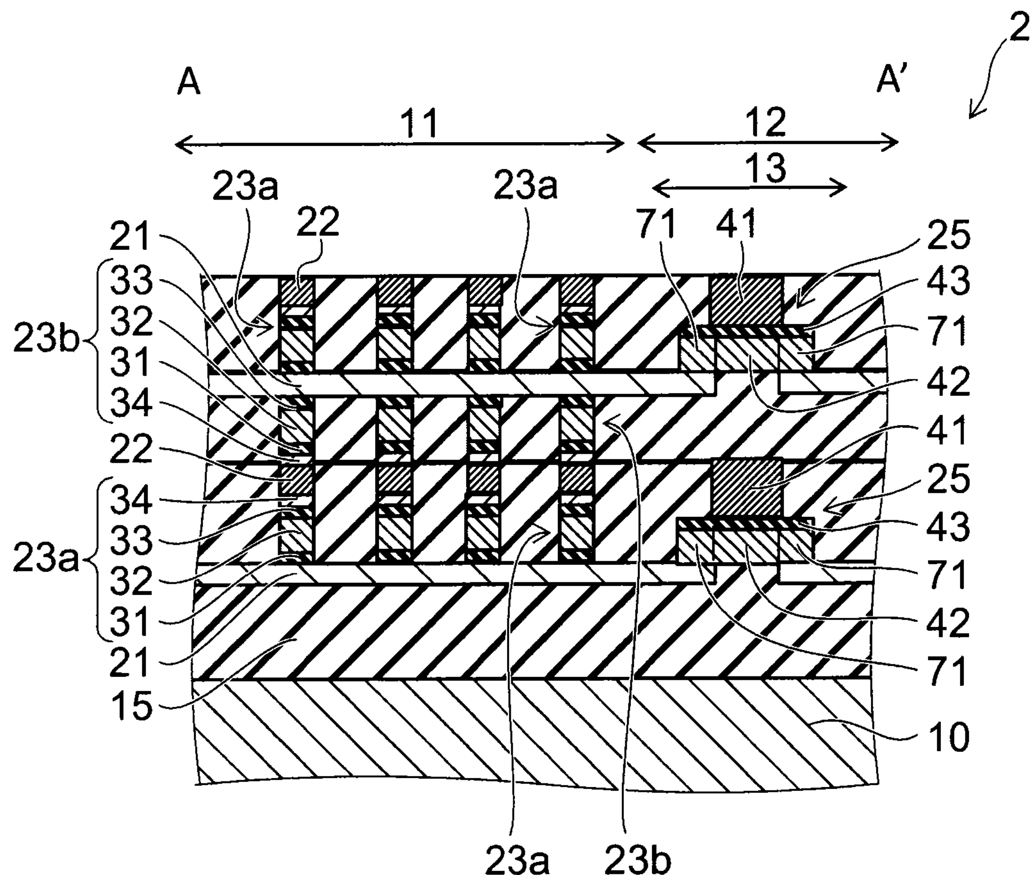
FIG. 14 is a sectional view taken along line A-A' shown in FIG. 13.
Figure 14:
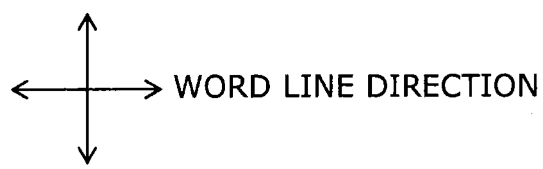

FIG. 14 is a sectional view taken along line A-A' shown in FIG. 13.

As shown in FIGS. 13 and 14, the memory device 2 according to the embodiment is different from the memory device 1 (see FIGS. 1 to 5B) according to the above first embodiment in the following points. The width of the gate lines 41 and 51 is narrower than the length of the polysilicon layers 42 and 52. The CMP stopper electrodes 35, 45, and 55 are not provided. Both end portions of the polysilicon layer 42 sandwiching the region immediately below the gate line 41 and both end portions of the polysilicon layer 52 sandwiching the region immediately below the gate line 51 are doped with impurity to form a source/drain layer 71. Thus, in the embodiment, the source, drain, and channel of the driver transistor are made of the same semiconductor layer.

The impurity doped in the source/drain layer 71 is e.g. arsenic (As) in the case where the word line driver transistor 25 and the bit line driver transistor 26 are configured as n-channel transistors, and e.g. boron (B) or boron difluoride ($BF_2$) in the case where the word line driver transistor 25 and the bit line driver transistor 26 are configured as p-channel transistors. The impurity concentration in the source/drain layer 71 is e.g. approximately $1\times10^{19}$-$1\times10^{21}$ $cm^{-3}$.

Next, a method for manufacturing the memory device 2 according to the embodiment is described.

FIGS. 15A to 16B illustrate the method for manufacturing a memory device according to the embodiment.

Figure 15A:
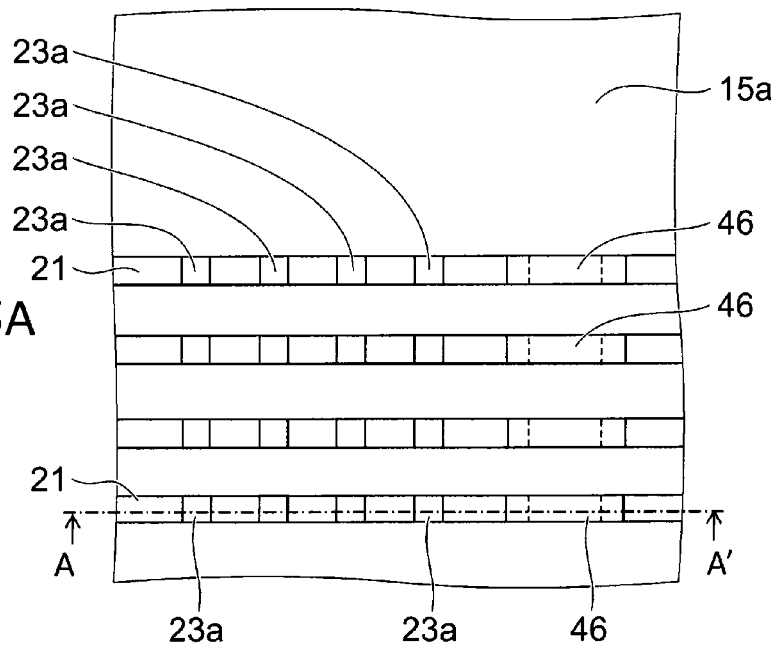
FIG. 15A is a plan view illustrating a method for manufacturing the memory device according to the second embodiment.
Figure 15B:
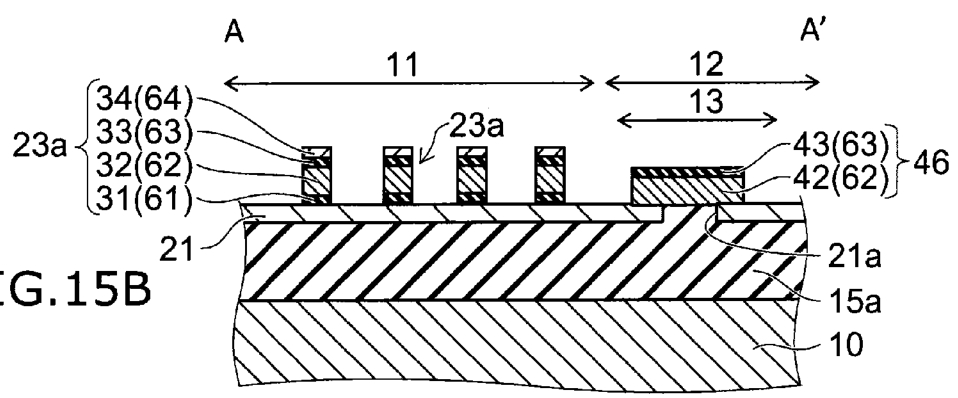
FIG. 15B is a sectional view taken along line A-A' shown in FIG. 15A.

First, the process from the step shown in FIGS. 5A and 5B to the step shown in FIGS. 7A and 7B is performed. Next, as shown in FIGS. 15A and 15B, the ion source metal electrode 64, the silicon oxide layer 63, the polysilicon layer 62, and the silicon oxide layer 61 are collectively patterned. Thus, in the memory cell array region 11, a columnar pillar 23*a* made of a silicon oxide layer 31, a polysilicon layer 32, a silicon oxide layer 33, and an ion source metal electrode 34 is formed. In the word line transistor region 13, a band-shaped stacked body 46 made of a polysilicon layer 42 and a silicon oxide layer 43 is formed.

Figure 16A:
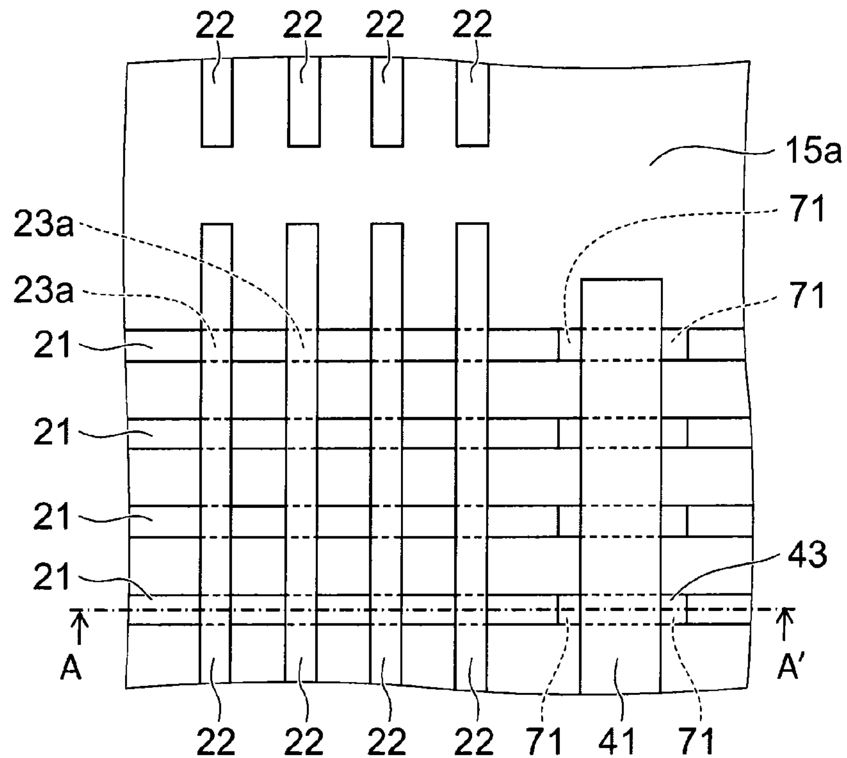
FIG. 16A is a plan view illustrating the method for manufacturing the memory device according to the second embodiment.
Figure 16B:
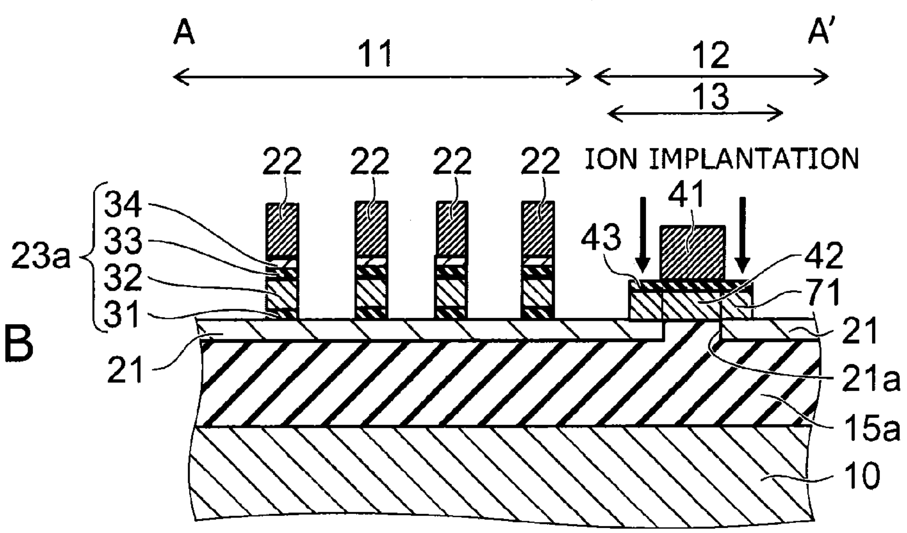
FIG. 16B is a sectional view taken along line A-A' shown in FIG. 16A.

Next, as shown in FIGS. 16A and 16B, a conductive material is deposited, and then patterned. Thus, bit lines 22 are formed in the memory cell array region 11, and a gate line 41 is formed in the word line transistor region 13. At this time, the width of the gate line 41 is made narrower than the longitudinal length of the stacked body 46 made of the polysilicon layer 42 and the silicon oxide layer 43 to expose both side portions of the stacked body.

Next, by using the gate line 41 as a mask, impurity is ion-implanted into the polysilicon layer 42. Thus, a pair of source/drain layers 71 are formed in both side portions of the polysilicon layer 42.

Next, as shown in FIGS. 13 and 14, an insulating material is deposited on the entire surface. CMP is performed on the upper surface to expose the bit lines 22 and the gate line 41. Thus, an interlayer insulating film 15 is embedded among the stacked body including the polysilicon layer 42, the silicon oxide layer 43, and the gate line 41, and the stacked bodies including the pillars 23*a* and the bit lines 22. The subsequent process is similar to that of the above first embodiment. Furthermore, by a similar process, impurity is ion-implanted also into both side portions of the polysilicon layer 52 to form source/drain layers 71.

Next, the effect of the embodiment is described.

According to the embodiment, the source/drain layer 71 is formed in the polysilicon layers 42 and 52. In the above first embodiment, the word line 21 and the bit line 22 are in direct contact with the non-doped polysilicon layers 42 and 52 without forming impurity diffusion layers in the polysilicon layers 42 and 52. Thus, compared with this case, the embodiment can reduce the source-drain parasitic resistance of the driver transistor, and increase the current driving capability. On the other hand, according to the above first embodiment, the word line driver transistor 25 and the bit line driver transistor 26 can be formed in a smaller number of steps.

The configuration, operation, manufacturing method, and effect of the embodiment other than the foregoing are similar to those of the above first embodiment.

In the example illustrated in the embodiment, the source/drain layer 71 is formed from an impurity diffusion layer. However, the source/drain layer is not limited thereto. The source/drain layer may be formed from a conductor such as metal or metal silicide.

Third Embodiment

Next, a third embodiment is described.

Figure 17:
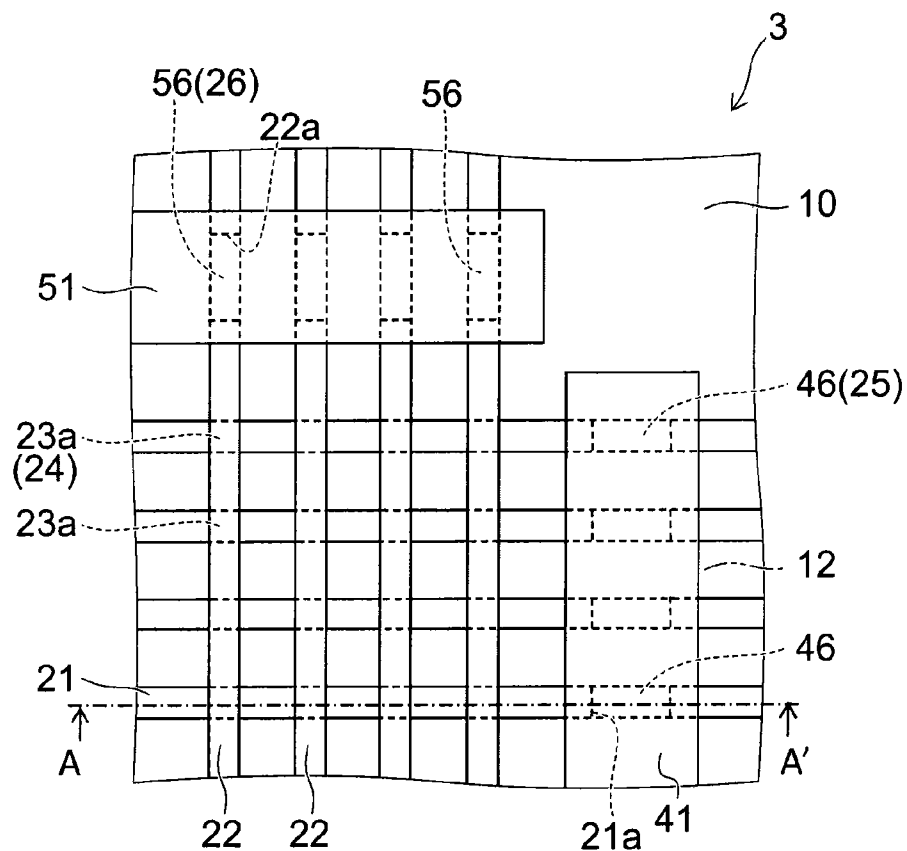
FIG. 17 is a plan view illustrating a memory device according to a third embodiment.
Figure 17:
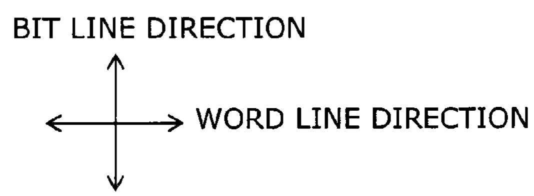

FIG. 17 is a plan view illustrating a memory device according to the embodiment.

Figure 18:
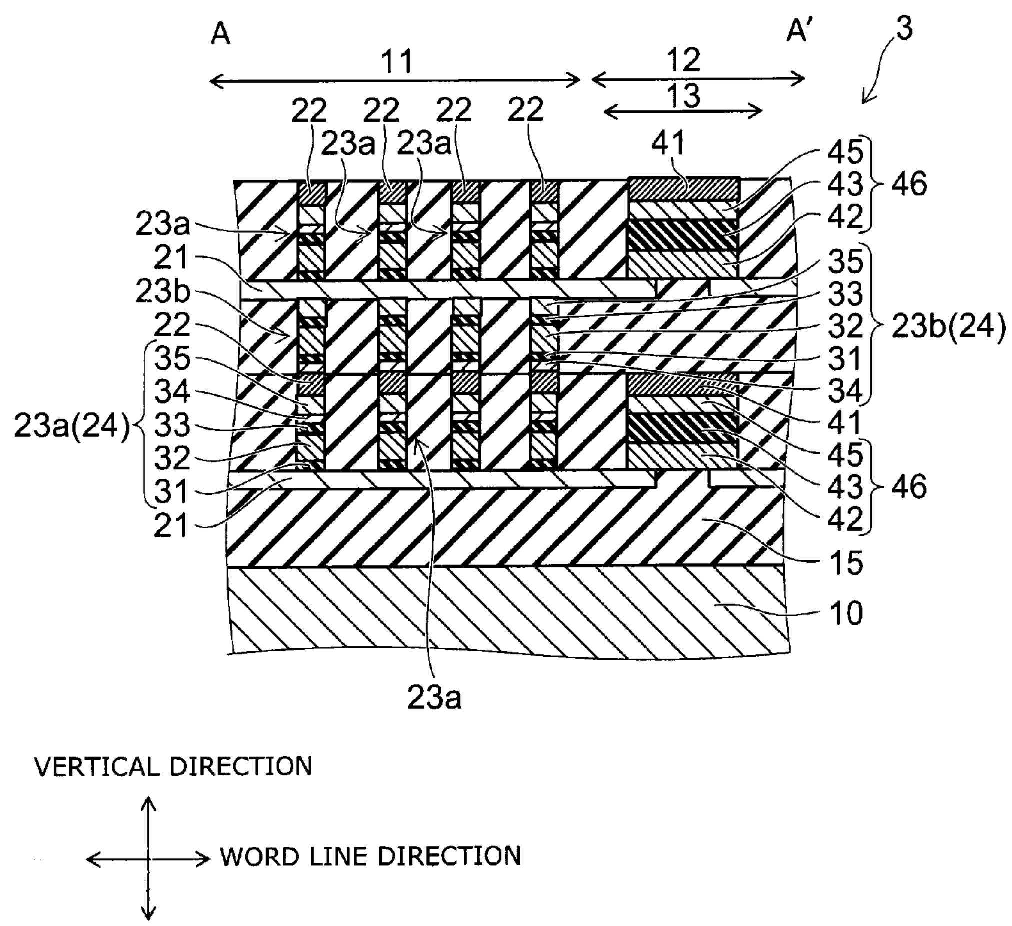
FIG. 18 is a sectional view taken along line A-A' shown in FIG. 17.

FIG. 18 is a sectional view taken along line A-A' shown in FIG. 17.

As shown in FIGS. 17 and 18, the memory device 3 according to the embodiment is different from the memory device 1 (see FIGS. 1 to 5B) according to the above first embodiment in that the thickness of the silicon oxide layers 43 and 53 constituting the gate insulating film of the driver transistor is different from the thickness of the silicon oxide layer 33 constituting part of the resistance change film of the memory cell 24. For instance, the silicon oxide layers 43 and 53 are thicker than the silicon oxide layer 33. Here, in FIGS. 17 and 18, the silicon oxide layer 53 of the bit line driver transistor 26 is not shown. However, the thickness of the silicon oxide layer 53 is equal to e.g. the thickness of the silicon oxide layer 43. In an example, the thickness of the silicon oxide layers 43 and 53 is 3-20 nm, and the thickness of the silicon oxide layer 33 is 1-10 nm.

Next, a method for manufacturing the memory device 3 according to the embodiment is described.

FIGS. 19A to 20B illustrate the method for manufacturing a memory device according to the embodiment.

First, the steps shown in FIGS. 5A and 5B and FIGS. 6A and 6B are performed.

Figure 19A:
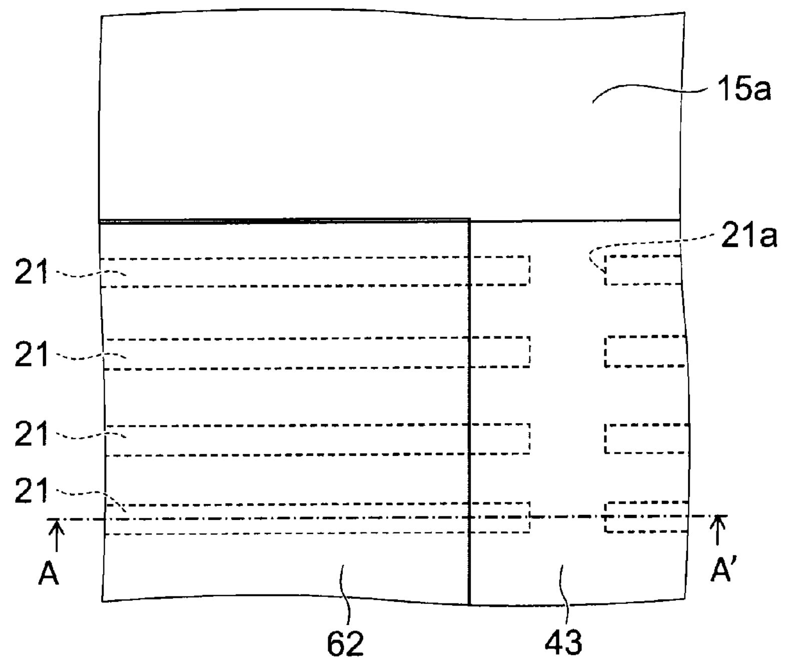
FIG. 19A is a plan view illustrating a method for manufacturing the memory device according to the third embodiment.
Figure 19B:
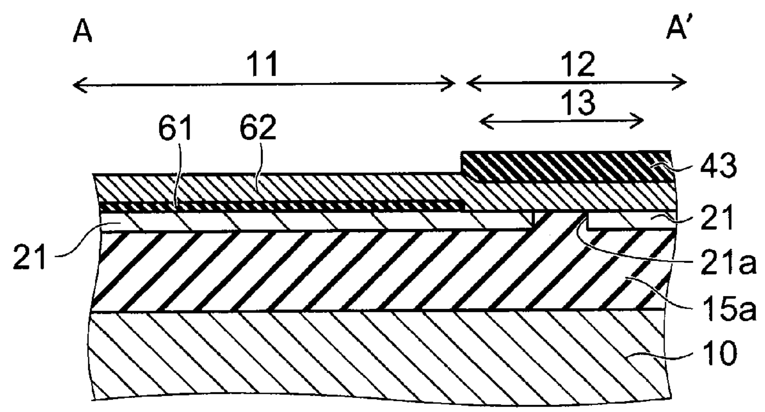
FIG. 19B is a sectional view taken along line A-A' shown in FIG. 19A.

Next, as shown in FIGS. 19A and 19B, a polysilicon layer 62 and a silicon oxide layer 43 are deposited on the entire surface. Next, the silicon oxide layer 43 is patterned and left only in the word line transistor region 13.

Figure 20A:
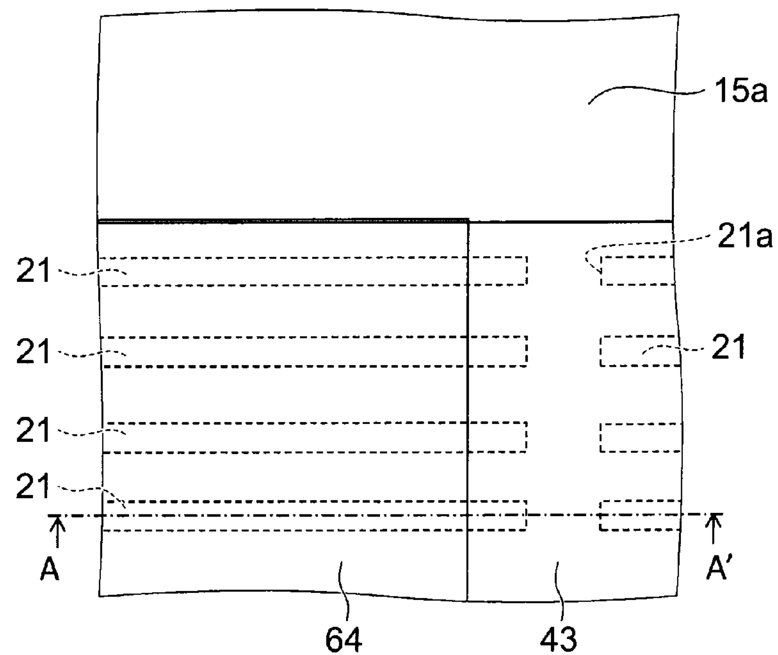
FIG. 20A is a plan view illustrating the method for manufacturing the memory device according to the third embodiment.
Figure 20B:
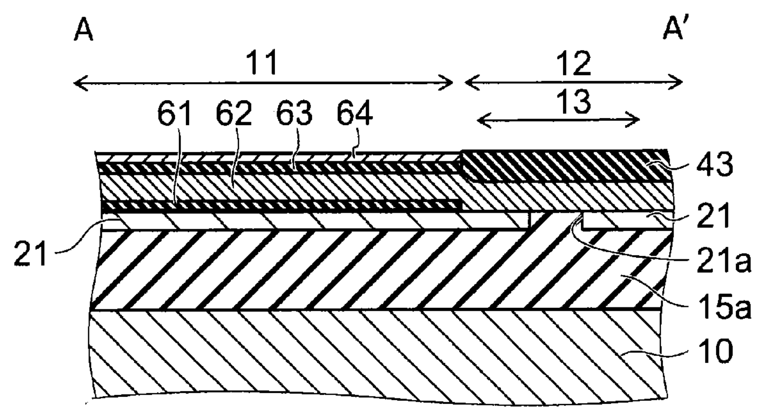
FIG. 20B is a sectional view taken along line A-A' shown in FIG. 20A.

Next, as shown in FIGS. 20A and 20B, a silicon oxide layer 63 and an ion source metal electrode 64 are deposited on the entire surface. At this time, the silicon oxide layer 63 is formed thinner than the silicon oxide layer 43. Next, the ion source metal electrode 64 and the silicon oxide layer 63 are patterned and left only in the memory cell array region 11. The subsequent process is similar to that of the above first embodiment. Furthermore, the silicon oxide layer 53 is also formed likewise.

Next, the effect of the embodiment is described.

According to the embodiment, the thickness of the gate insulating film of the word line driver transistor 25 and the bit line driver transistor 26, and the thickness of the silicon oxide layer 33 of the memory cell 24 can be configured so as to optimize the characteristics of each element. For instance, for the driver transistor, the gate oxide film can be thickened to increase the gate breakdown voltage. For the memory cell, the gate oxide film can be thinned to reduce the set voltage.

The configuration, operation, manufacturing method, and effect of the embodiment other than the foregoing are similar to those of the above first embodiment. Also in the embodiment, as in the above second embodiment, a source/drain layer 71 doped with impurity may be formed in the polysilicon layers 42 and 52. This can reduce the source-drain parasitic resistance.

Fourth Embodiment

Next, a fourth embodiment is described.

Figure 21:
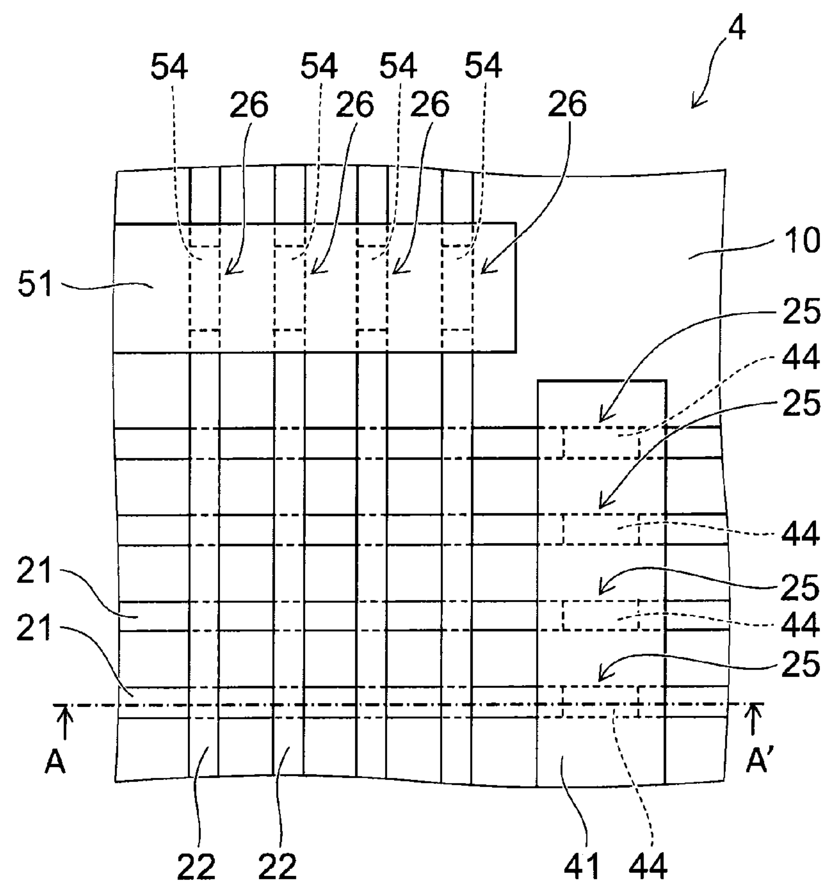
FIG. 21 is a plan view illustrating a memory device according to a fourth embodiment.
Figure 21:
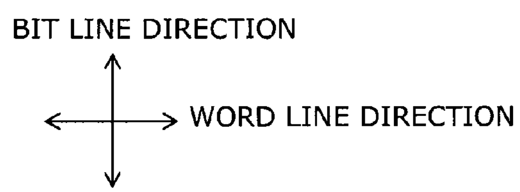

FIG. 21 is a plan view illustrating a memory device according to the embodiment.

Figure 22:
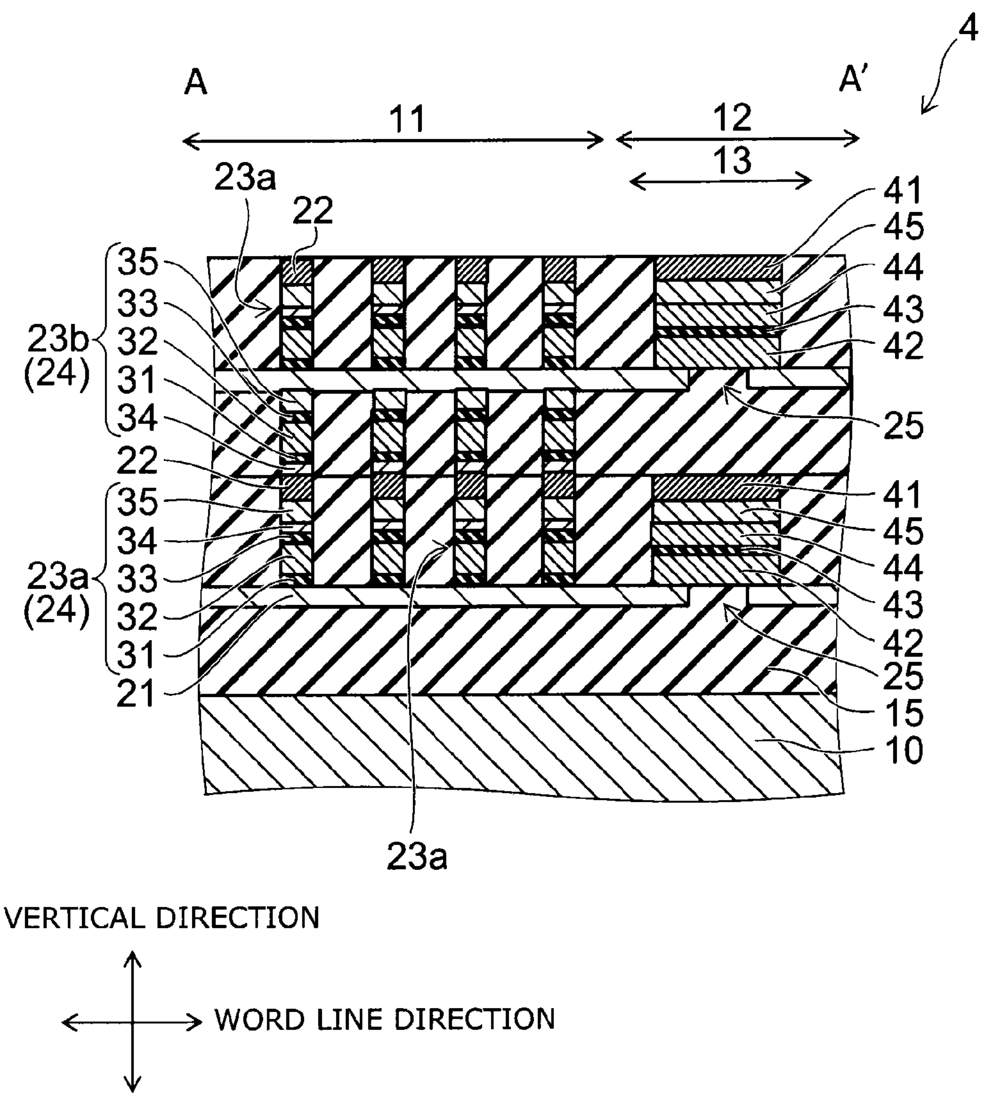
FIG. 22 is a sectional view taken along line A-A' shown in FIG. 21.

FIG. 22 is a sectional view taken along line A-A' shown in FIG. 21.

As shown in FIGS. 21 and 22, the memory device 4 according to the embodiment is different from the memory device 1 (see FIGS. 1 to 5B) according to the above first embodiment in the following points. A polysilicon electrode 44 is provided between the silicon oxide layer 43 and the CMP stopper electrode 45 in the word line driver transistor 25. A polysilicon electrode 54 is provided between the silicon oxide layer 53 and the CMP stopper electrode 55 in the bit line driver transistor 26. Thus, in these driver transistors, the lower portion of the gate electrode is formed from polysilicon.

The thickness of the polysilicon electrodes 44 and 54 is e.g. approximately 3-50 nm. If the driver transistor is an n-channel transistor, the polysilicon electrodes 44 and 54 are doped with donor impurity such as phosphorus (P) or arsenic (As). If the driver transistor is a p-channel transistor, the polysilicon electrodes 44 and 54 are doped with acceptor impurity such as boron (B) or boron difluoride ($BF_2$). The concentration of impurity is e.g. approximately $1\times10^{19}$-$1\times10^{21}$ $cm^{-3}$.

Next, a method for manufacturing the memory device 4 according to the embodiment is described.

Figure 23A:
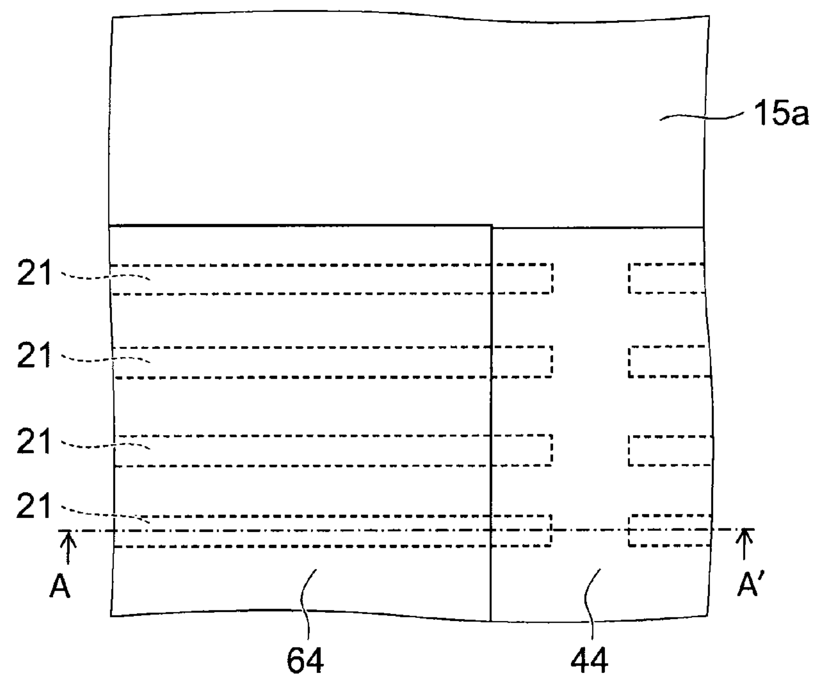
FIG. 23A is a plan view illustrating a method for manufacturing the memory device according to the fourth embodiment.
Figure 23B:
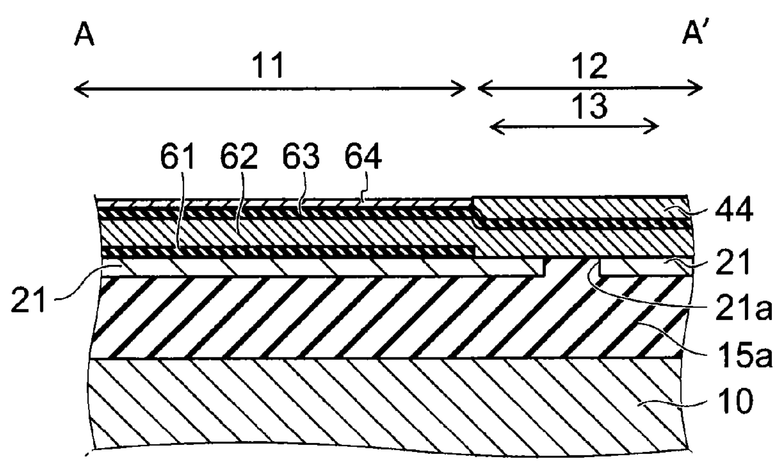
FIG. 23B is a sectional view taken along line A-A' shown in FIG. 23A.

FIGS. 23A and 23B illustrate the method for manufacturing a memory device according to the embodiment.

First, the process from the step shown in FIGS. 5A and 5B to the step shown in FIGS. 7A and 7B is performed.

Next, as shown in FIGS. 23A and 23B, polysilicon doped with impurity is deposited on the entire surface to form a polysilicon electrode 44. Next, the polysilicon electrode 44 is patterned and left only in the word line transistor region 13.

The subsequent process is similar to that of the above first embodiment. More specifically, as shown in FIGS. 8A and 8B, a CMP stopper electrode 65 is deposited on the entire surface. Then, as shown in FIGS. 9A and 9B, patterning is collectively performed to form pillars 23*a* and the like. The polysilicon electrode 54 of the bit line driver transistor 26 is also formed likewise.

Next, the effect of the embodiment is described.

According to the embodiment, the lower portion of the gate electrode of the word line driver transistor 25 and the bit line driver transistor 26 is formed from polysilicon containing impurity. Thus, compared with the case where the gate electrode is entirely formed from metal, the threshold voltage of the driver transistor can be decreased. This can improve the current driving capability of the driver transistor.

The configuration, operation, manufacturing method, and effect of the embodiment other than the foregoing are similar to those of the above first embodiment. Also in the embodiment, as in the above second embodiment, a source/drain layer 71 doped with impurity may be formed in the polysilicon layers 42 and 52. This can reduce the source-drain parasitic resistance.

Fifth Embodiment

Next, a fifth embodiment is described.

Figure 24:
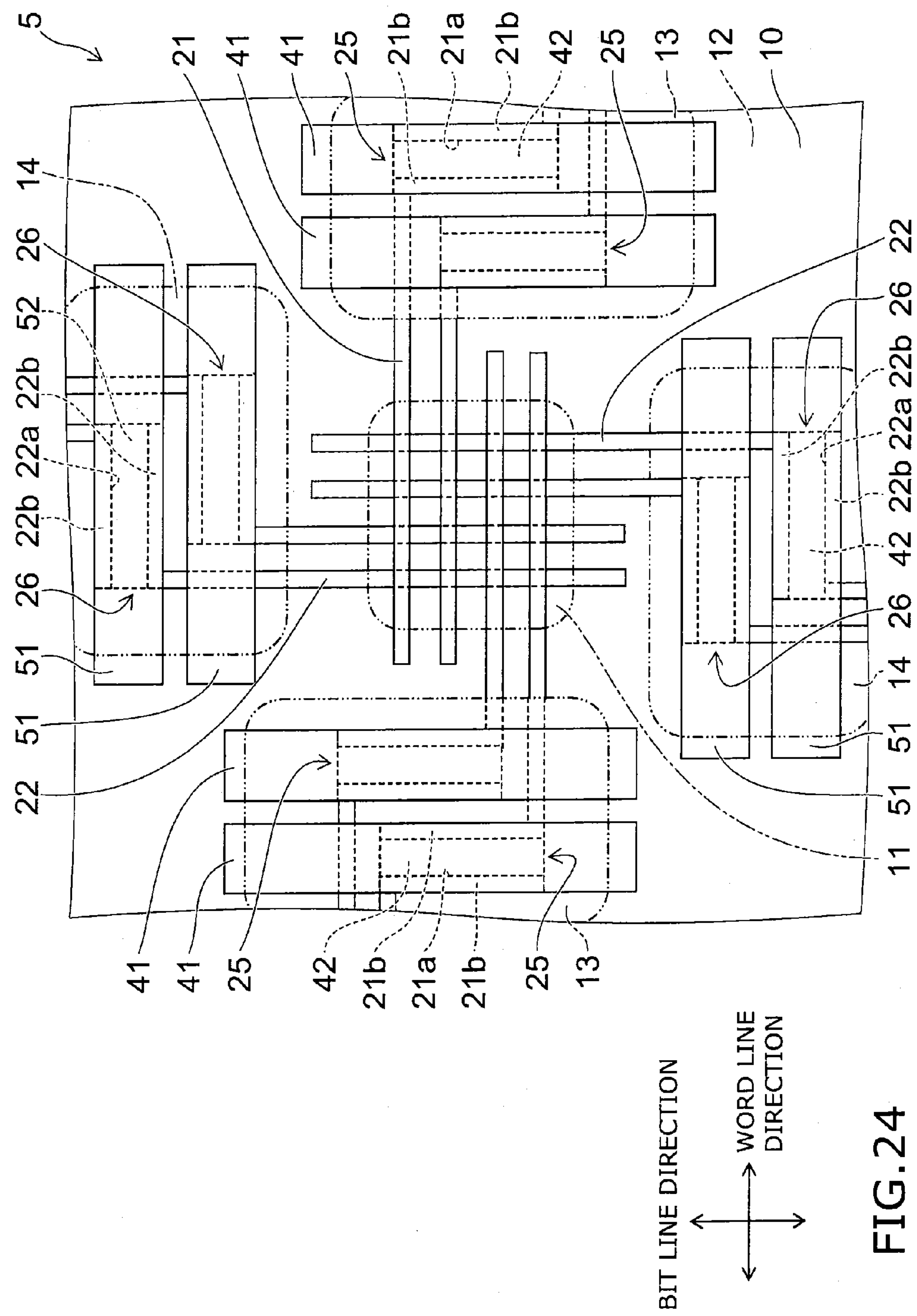
FIG. 24 is a plan view illustrating a memory device according to a fifth embodiment.

FIG. 24 is a plan view illustrating a memory device according to the embodiment.

As shown in FIG. 24, the memory device 5 according to the embodiment is different from the memory device 1 (see FIGS. 1 to 5B) according to the above first embodiment in that the gate width of the driver transistor is wider, and that the driver transistors are arranged horizontally in multiple stages instead.

Specifically, in the word line transistor region 13, a pair of end portions 21*b* sandwiching the divided portion 21*a* of the word line 21 are bent, extend in the bit line direction, and are opposed to each other. Immediately above the pair of end portions 21*b* sandwiching the divided portion 21*a*, a polysilicon layer 42 is provided. As a result, the gate width of the word line driver transistor 25 is larger than the width of the word line 21.

In the above first embodiment, the word line driver transistors 25 are arranged in a line along the bit line direction. However, in the embodiment, a pair of word line transistor regions 13 are placed at positions sandwiching the memory cell array region 11. In each word line transistor region 13, the word line driver transistors 25 are arranged in a plurality of rows. Between the rows, the positions in the bit line direction of the word line driver transistors 25 are shifted from each other. For each row, a gate line 41 extending in the bit line direction is provided.

Likewise, in the bit line transistor region 14, a pair of end portions 22*b* sandwiching the divided portion 22*a* of the bit line 22 are bent, extend in the word line direction, and are opposed to each other. Immediately above the pair of end portions 22*b* sandwiching the divided portion 22*a*, a polysilicon layer 52 is provided. As a result, the gate width of the bit line driver transistor 26 is larger than the width of the bit line 22.

Instead, a pair of bit line transistor regions 14 are placed at positions sandwiching the memory cell array region 11. In each bit line transistor region 14, the bit line driver transistors 26 are arranged in a plurality of rows. Between the rows, the positions in the word line direction of the bit line driver transistors 26 are shifted from each other. Each row extends in the word line direction. For each row, a gate line 51 extending in the word line direction is provided.

According to the embodiment, the gate width of the driver transistor is not limited by the width of the word line and the bit line. Thus, the gate width can be freely designed so as to optimize the characteristics of the transistor. Here, in FIG. 24, in each word line transistor region 13, two rows of word line driver transistors 25 are shown. However, the number of rows is determined as necessary. The same also applies to the number of rows of the bit line driver transistors 26.

In the embodiment, as in the above first embodiment, the channel member of the word line driver transistor and the bit line driver transistor is formed from polysilicon. Thus, there is concern that the driving current is smaller than that of the transistor with the channel formed in the monocrystalline silicon substrate 10 (hereinafter referred to as "monocrystalline transistor"). However, assume that the carrier mobility in polysilicon is ¼ times the carrier mobility in monocrystalline silicon. The driving current in a short channel transistor is generally proportional to the square root of the mobility. Thus, the driving current of the transistor with the channel formed from polysilicon (hereinafter referred to as "polytransistor") is ½ times the driving current of the monocrystalline transistor. Accordingly, the polytransistor can achieve the same driving current as the monocrystalline transistor if the gate width of the polytransistor is set to twice the gate width of the monocrystalline transistor. In the embodiment, the gate width of the driver transistor can be freely designed. Thus, in order to compensate for the performance degradation in the polysilicon channel, the gate width can be designed to be wider.

As described above, if the driver transistor is configured as a polytransistor, the gate width is made twice larger than in the case of a monocrystalline transistor. Thus, the footprint of the driver transistors is also made approximately twice. However, as described in the first embodiment, by configuring the driver transistor as a polytransistor, with the stacking of memory cells, the driver transistors can also be stacked. Thus, even if the number of stacked layers of the memory cells is increased, there is no increase in the footprint of the driver transistors.

For instance, suppose that the number of stacked layers of the memory cells is set to 2. In the case where the driver transistor is configured as a monocrystalline transistor, all the driver transistors need to be arranged in a plane. Thus, the footprint of the driver transistors is made twice that in the case where the number of stacked layers is 1. On the other hand, in the case where the driver transistor is configured as a polytransistor, the area of each transistor is made twice. However, the transistors can be stacked in two levels. Thus, the footprint of the entire driver transistors is equal to that in the case where the number of stacked layers is 1. Accordingly, in the case where the number of stacked layers is set to 2, the polytransistor and the monocrystalline transistor are nearly comparable in terms of the footprint of the entire driver transistors.

However, suppose that the number of stacked layers of the memory cells is set to 8. In the case where the driver transistor is configured as a monocrystalline transistor, the total footprint is four times that in the case where the number of stacked layers is 2. On the other hand, in the case where the driver transistor is configured as a polytransistor, the total footprint is equal to that in the case where the number of stacked layers is 2. Thus, in the case where the number of stacked layers is set to 8, the total footprint in the case where the driver transistor is configured as a polytransistor is ¼ of the total footprint in the case where the driver transistor is configured as a monocrystalline transistor. Thus, with the increase in the number of stacked layers of the memory cells, the polytransistor is made more advantageous, and the entire memory device can be downsized.

The configuration, operation, manufacturing method, and effect of the embodiment other than the foregoing are similar to those of the above first embodiment.

(Variation of the Fifth Embodiment)

Next, a variation of the fifth embodiment is described.

Figure 25:
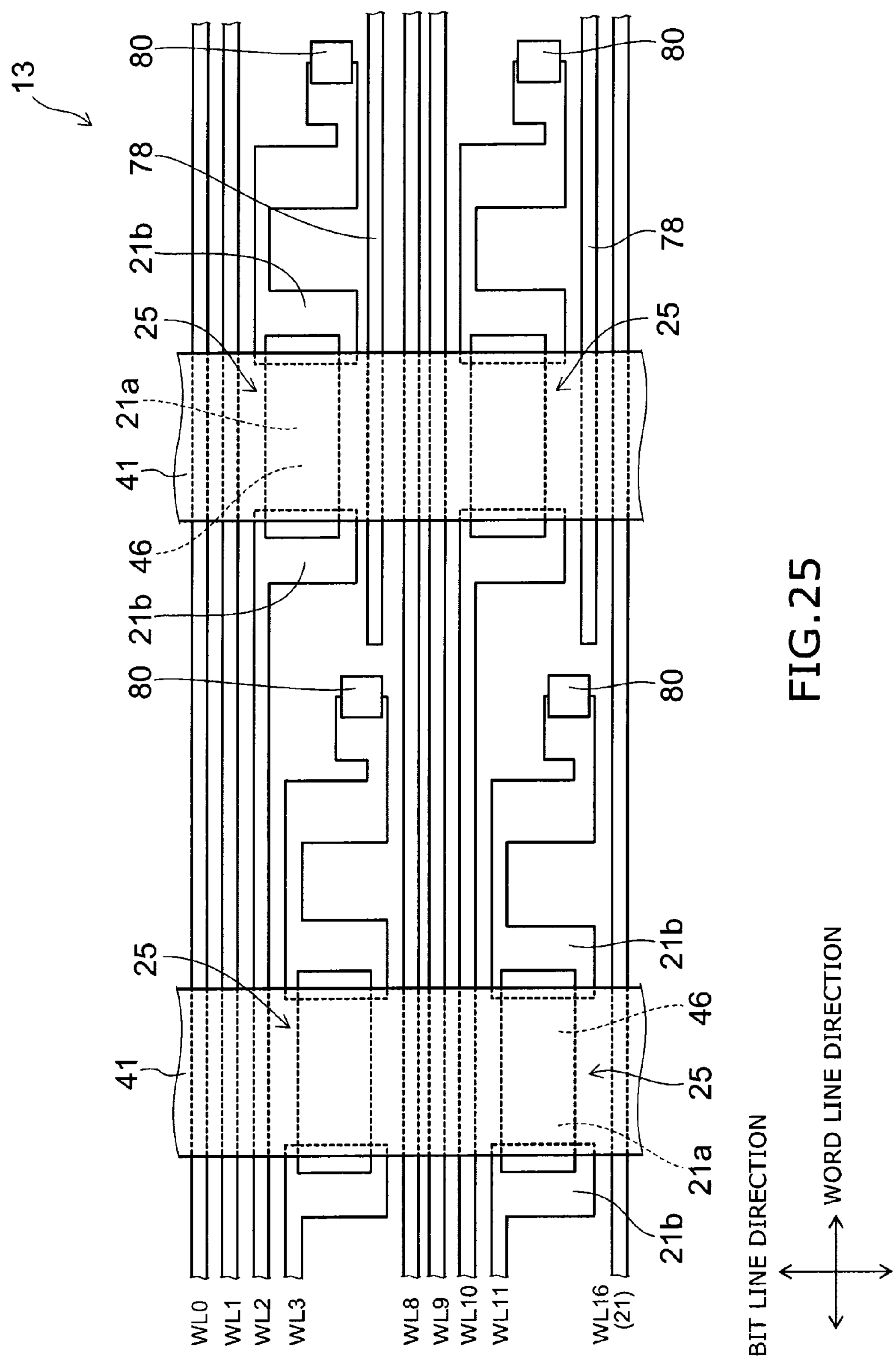
FIG. 25 is a plan view illustrating the word line transistor region in a memory device according to a variation of the fifth embodiment.

FIG. 25 is a plan view illustrating the word line transistor region in a memory device according to this variation.

In FIG. 25, in order to distinguish individual word lines 21, the word lines 21 are labeled with symbols "WL0" to "WL16".

As shown in FIG. 25, in this variation, four adjacent word lines 21 constitute one group, and adjacent groups are alternately extracted to word line transistor regions 13 on opposite sides. In each group, the positions in the word line direction of the word line driver transistors 25 are shifted from each other. The word line driver transistors 25 equal in position in the word line direction share the same gate line 41. The number of gate lines 41 provided in each word line transistor region 13 is equal to the number of word lines constituting one group. The width of the end portion 21*b* in each word line 21 is wider than the width of the other portion. Furthermore, the tip portion of each word line 21 on the opposite side of the memory cell array region 11 as viewed from the word line driver transistor 25 is connected to a contact 80. The contact 80 may collectively connect the word lines 21 of a plurality of layers arranged vertically.

Thus, each word line 21 extracted from the memory cell array region 11 is mediated by the word line driver transistor 25 in the divided portion 21*a*, and terminated in the region connected to the contact 80. On the extension line of each word line 21, beyond the region connected to the contact 80, a dummy wiring 78 is provided. The dummy wiring 78 is insulated from the word line 21, and does not function as a current path. However, the dummy wiring 78 is provided to facilitate lithography.

Specifically, four word lines WL0-WL3 constitute one group, and are extracted to one word line transistor region 13. Furthermore, four word lines WL8-WL11 also constitute one group, and are extracted to the same word line transistor region 13. In contrast, word lines WL4-WL7 (not shown) and word lines WL12-WL15 (not shown) each constitute a group, and are extracted to the other word line transistor region 13 (not shown). The word line driver transistor 25 connected to the word line WL3 and the word line driver transistor 25 connected to the word line WL11 are equal in position in the word line direction, and the gate electrodes thereof are connected to the same gate line 41. The same gate line 41 is extended in the bit line direction. The word line driver transistor 25 connected to the word line WL2 and the word line driver transistor 25 connected to the word line WL10 are equal in position in the word line direction, and the gate electrodes thereof are connected to the same other gate line 41. In each word line transistor region 13, four gate lines are provided.

For instance, in the case where the number of word lines is 32, 16 word lines are extracted to the word line transistor region 13 on one side. In this case, the word line driver transistors 25 are arranged like a 4×4 matrix. Here, in FIG. 25, only 2×2 word line driver transistors 25 are shown. In the case where the number of word lines is 64, 32 word lines are extracted to the word line transistor region 13 on one side, and the word line driver transistors 25 are arranged like a 8×4 matrix.

In the case where the number of word lines constituting one group is n, the gate width of the word line driver transistor 25 is preferably set to less than or equal to (arrangement pitch of word lines)×n. Furthermore, from the viewpoint of alignment in lithography, the width of the stacked body 46 is preferably made narrower than the width of the end portion 21*b* of the word line 21.

The same also applies to the arrangement of the bit lines 22 and the bit line driver transistors 26 in the bit line transistor region 14.

The configuration, operation, manufacturing method, and effect of this variation other than the foregoing are similar to those of the above fifth embodiment.

In the example illustrated in this variation, one group is constituted by four word lines. However, the group is not limited thereto. The group may be constituted by e.g. 2 or 8 word lines.

Sixth Embodiment

Next, a sixth embodiment is described.

Figure 26:
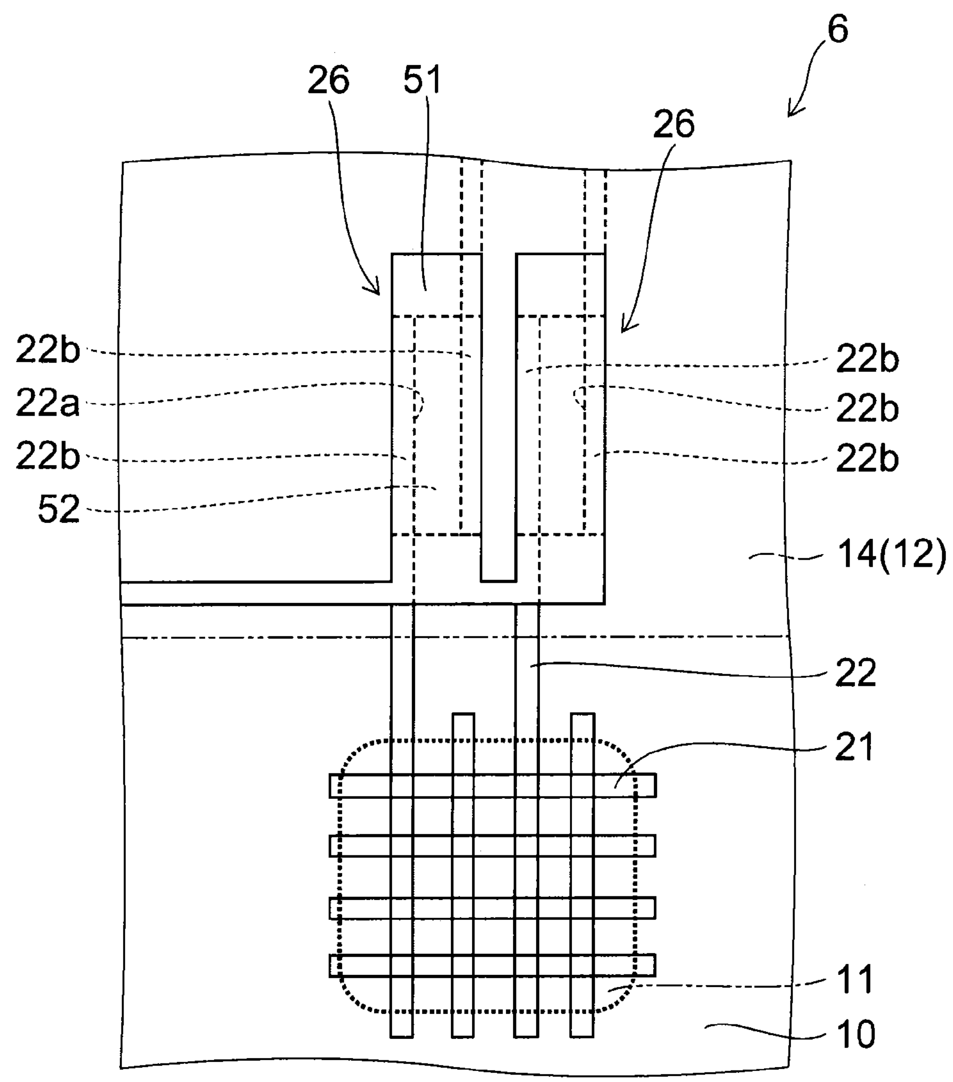
FIG. 26 is a plan view illustrating a memory device according to a sixth embodiment.

FIG. 26 is a plan view illustrating a memory device according to the embodiment.

In FIG. 26, the word line driver transistor 25 is omitted, and only the bit line driver transistor 26 is shown.

As shown in FIG. 26, the memory device 6 according to the embodiment is different from the memory device 5 (see FIG. 25) according to the above fifth embodiment in that the word line 21 and the bit line 22 are not bent, but the end portions sandwiching the divided portion are shifted from and opposed to each other.

Thus, the word line driver transistor 25 is placed with the gate length direction being the bit line direction and the gate width direction being the word line direction. The bit line driver transistor 26 is placed with the gate length direction being the word line direction and the gate width direction being the bit line direction. The gate lines 41 and 51 are shaped like combs, and the comb tooth portions are placed immediately above the polysilicon layers 42 and 52.

By such a configuration, the length in the bit line direction of the bit line driver transistor 26 is made longer by reflecting the gate width. However, the length in the word line direction depends on the gate length, and is not made so long. Thus, in the case where the length in the word line direction of the bit line driver transistor 26 is less than or equal to twice the arrangement pitch of the bit lines 22, the bit line transistor regions 14 can be defined at two positions sandwiching the memory cell array region 11 so that every other bit line 22 is extracted to one bit line transistor region 14. Then, in each bit line transistor region 14, the bit line driver transistors 26 can be arranged in a line along the word line direction. As a result, the layout of the wirings is simplified, and the peripheral circuit region 12 can be entirely downsized.

The embodiment can also achieve an effect similar to that of the above fifth embodiment. The configuration, operation, manufacturing method, and effect of the embodiment other than the foregoing are similar to those of the above first embodiment.

Also in the above first to fourth embodiments, as in the embodiment, a pair of word line transistor regions 13 and a pair of bit line transistor regions 14 may be placed so as to sandwich the memory cell array region 11. In this case, the driver transistors can be alternately placed on both sides of the memory cell array region 11. Then, the area of the peripheral circuit region 12 is increased a little. However, a margin can be provided to the arrangement spacing of the driver transistors.

(Variation of the Sixth Embodiment)

Next, a variation of the sixth embodiment is described.

Figure 27:
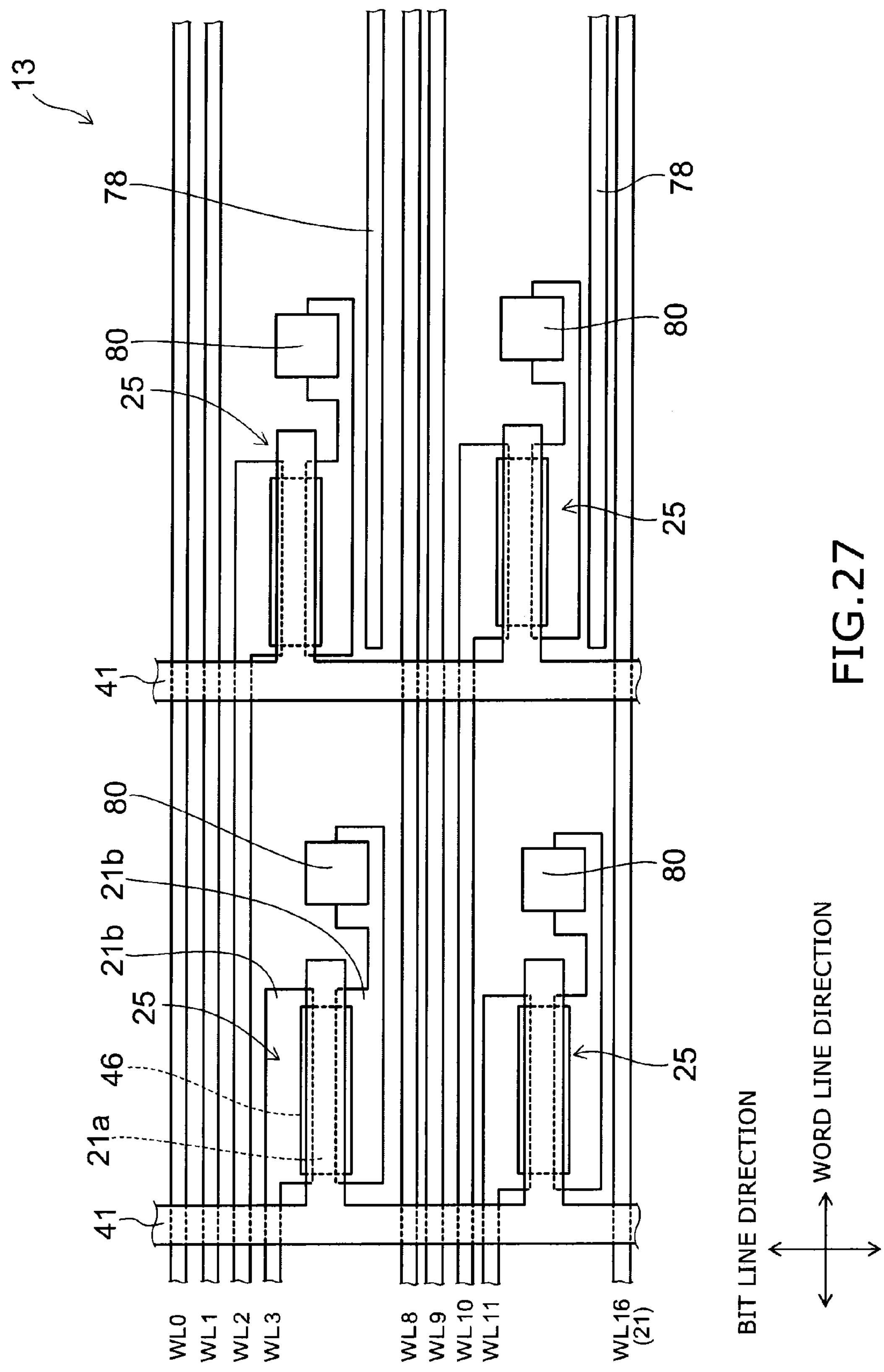
FIG. 27 is a plan view illustrating the word line transistor region in a memory device according to a variation of the sixth embodiment.

FIG. 27 is a plan view illustrating the word line transistor region in a memory device according to this variation.

In FIG. 27, in order to distinguish individual word lines 21, the word lines 21 are labeled with symbols "WL0" to "WL16".

As shown in FIG. 27, in this variation, as in the variation (see FIG. 25) of the fifth embodiment described above, four adjacent word lines 21 constitute one group, and adjacent groups are alternately extracted to word line transistor regions 13 on opposite sides. In each group, the positions in the word line direction of the word line driver transistors 25 are shifted from each other. The word line driver transistors 25 equal in position in the word line direction share the same gate line 41. However, the gate line 41 is shaped like a comb. The number of gate lines 41 provided in each word line transistor region 13 is equal to the number of word lines constituting one group. The width of the end portion 21*b* in each word line 21 is wider than the width of the other portion.

The arrangement of the word line driver transistors 25 is similar to that of the variation (see FIG. 25) of the fifth embodiment described above. More specifically, in the case where the number of word lines is 32, 16 word lines are extracted to the word line transistor region 13 on one side. In this case, the word line driver transistors 25 are arranged like a 4×4 matrix. In the case where the number of word lines is 64, 32 word lines are extracted to the word line transistor region 13 on one side, and the word line driver transistors 25 are arranged like a 8×4 matrix.

From the viewpoint of alignment in lithography, the width of the stacked body 46 is preferably made narrower than the width of the end portion 21*b* of the word line 21.

The same also applies to the arrangement of the bit lines 22 and the bit line driver transistors 26 in the bit line transistor region 14.

The configuration, operation, manufacturing method, and effect of this variation other than the foregoing are similar to those of the above sixth embodiment.

In the example illustrated in this variation, one group is constituted by four word lines. However, the group is not limited thereto. The group may be constituted by e.g. 2 or 8 word lines.

The embodiments described above can realize a memory device in which the degree of integration is easily increased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

For instance, in the above embodiments, the memory cell shaped like a pillar is described. However, the invention is not limited thereto. Stacked layers constituting a memory cell may be formed entirely between the word line wiring layer and the bit line wiring layer.

In the above embodiments, only the word line driver transistor and the bit line driver transistor are stacked. However, transistors of the other peripheral circuit may also be stacked.

What is claimed is:

1. A memory device comprising:
- word line wiring layers, each of the word line wiring layers including a plurality of first word lines extending in a first direction and a plurality of second word lines extending in the first direction;
- bit line wiring layers, each of the bit line wiring layers including a plurality of first bit lines extending in a second direction crossing the first direction and a plurality of second bit lines extending in the second direction;
- a memory cell connected between each of the first word lines and each of the first bit lines;
- a first semiconductor layer provided across each of the first word lines and each of the second word lines;
- a first gate provided on the first semiconductor layer;
- a first insulating layer provided between the first semiconductor layer and the first gate;
- a second semiconductor layer provided across each of the first bit lines and each of the second bit lines;
- a second gate provided on the second semiconductor layer; and
- a second insulating layer provided between the second semiconductor layer and the second gate,
- first sets each of which include the first semiconductor layer, the first gate and the first insulating layer, each of the first sets being disposed with each of the word line wiring layers,
- second sets each of which include the second semiconductor layer, the second gate and the second insulating layer, each of the second sets being disposed with each of the bit line wiring layers,
- each of the word line wiring layers and each of the bit line wiring layers being alternately stacked,
- the first sets being stacked in a stacking direction of the word line wiring layers and the bit line wiring layers, and
- the second sets being stacked in the stacking direction.

2. The device according to claim 1, wherein
- material of the first gate is same as material of the first and second bit lines, and
- material of the second gate is same as material of the first and second word lines.

3. The device according to claim 1, wherein
- the memory cell includes:
  - a silicon layer; and
  - a silicon oxide layer,
- the first semiconductor layer and the second semiconductor layer are silicon layers, and
- the first insulating layer and the second insulating layer are silicon oxide layers.

4. The device according to claim 1, wherein gate length direction of the first gate is the first direction, and gate length direction of the second gate is the second direction.

5. The device according to claim 1, wherein gate width direction of the first gate is the first direction, and gate width direction of the second gate is the second direction.

6. The device according to claim 1, wherein in the first and second word lines, width of end portions is wider than width of a portion in contact with the memory cell.

7. The device according to claim 1, wherein in the first and second word lines, width of end portions is nearly equal to width of a portion in contact with the memory cell.

8. The device according to claim 1, wherein the first gate, the first insulating layer, and the first semiconductor layer constitute a first transistor, and the first transistors are arranged like a matrix.

9. The device according to claim 1, wherein the first gate, the first insulating layer, and the first semiconductor layer constitute a first transistor, and a first transistor region including the first transistor is placed so as to sandwich a memory cell array including the memory cell.

10. The device according to claim 1, wherein the first gate, the first insulating layer, and the first semiconductor layer constitute a first transistor, and the first transistors are arranged in a line in the second direction.

11. A memory device comprising:
- word line wiring layers, each of the word line wiring layers including a plurality of first word lines extending in a first direction and a plurality of second word lines extending in the first direction;
- bit line wiring layers, each of the bit line wiring layers including a plurality of first bit lines extending in a second direction crossing the first direction and a plurality of second bit lines extending in the second direction;
- a memory cell connected between each of the first word lines and each of the first bit lines, the memory cell includes:
  - a first silicon oxide layer;
  - a first silicon layer; and
  - a second silicon oxide layer;
- a second silicon layer provided across each of the first word lines and each of the second word lines;
- a first gate provided on the second silicon layer;
- a third silicon oxide layer provided between the second silicon layer and the first gate;
- a third silicon layer provided across each of the first bit lines and each of the second bit lines;
- a second gate provided on the third silicon layer; and
- a fourth silicon oxide layer provided between the third silicon layer and the second gate, first sets each of which include the second silicon layer, the first gate and the third silicon oxide layer, each of first sets being disposed with each of the word line wiring layers, second sets each of which include the third silicon layer, the second gate and the fourth silicon oxide layer, each of second sets being disposed with each of the bit line wiring layers, each of the word line wiring layers and each of the bit line wiring layers being alternately stacked, the first sets being stacked in a stacking direction of the word line wiring layers and the bit line wiring layers, and the second sets being stacked in the stacking direction.

* * * * *